(12) United States Patent
Aarts et al.

(10) Patent No.: US 8,407,035 B2
(45) Date of Patent: Mar. 26, 2013

(54) DYNAMICALLY ADJUSTING SIMULATION FIDELITY IN A SELF-OPTIMIZED SIMULATION OF A COMPLEX SYSTEM

(75) Inventors: Thomas W. Aarts, Mantorville, MN (US); Ched D. Hays, Austin, TX (US); Michael C. Hollinger, Round Rock, TX (US); Jason S. Ma, Austin, TX (US); Jose L. Ortiz, Austin, TX (US); Gundam Raghuswamyreddy, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 12/854,952

(22) Filed: Aug. 12, 2010

(65) Prior Publication Data

US 2012/0041741 A1 Feb. 16, 2012

(51) Int. Cl.
*G06F 7/60* (2006.01)
*G06F 17/10* (2006.01)
*G06F 17/50* (2006.01)
*G06G 7/62* (2006.01)

(52) U.S. Cl. ............................................. 703/13; 703/2
(58) Field of Classification Search .................. 703/6, 2, 703/13
See application file for complete search history.

(56) References Cited

U.S. PATENT DOCUMENTS

| 5,832,467 | A | 11/1998 | Wavish | |
|---|---|---|---|---|
| 7,006,963 | B1 | 2/2006 | Maurer | |
| 2005/0050489 | A1 | 3/2005 | Chen et al. | |
| 2007/0061038 | A1* | 3/2007 | Takenaka et al. | 700/245 |
| 2007/0088532 | A1 | 4/2007 | Alvarez et al. | |
| 2007/0192079 | A1* | 8/2007 | Rompaey et al. | 703/19 |
| 2008/0319897 | A1 | 12/2008 | Fahner et al. | |
| 2009/0029651 | A1 | 1/2009 | Polini et al. | |
| 2009/0030659 | A1 | 1/2009 | Beckman et al. | |
| 2009/0030771 | A1 | 1/2009 | Eder | |
| 2009/0150136 | A1 | 6/2009 | Yang | |
| 2011/0184713 | A1* | 7/2011 | Yang | 703/13 |

OTHER PUBLICATIONS

U.S. Appl. No. 12/854,945.
U.S. Appl. No. 12/854,964.
U.S. Appl. No. 12/854,980.
U.S. Appl. No. 12/855,014.
"Simics Hindsight", Wind River Systems, Inc., http://www.virtutech.com/products/simics_hindsight.html, Accessed online Aug. 9, 2010, 2 pages.
Canal, Ramon et al., "Very Low Power Pipelines using Significance Compression", IEEE 2000, pp. 1-10.
Castner, Amy et al., "An Agent-Supported Simulation Framework for Metric-Aware Dynamic Fidelity Modeling", The Johns Hopkins University, Applied Physics Laboratory, Agent-Direct Simulation Spring Simulation MultiConference, 2007, 23 pages.

(Continued)

*Primary Examiner* — David Silver
(74) *Attorney, Agent, or Firm* — Stephen J. Walder, Jr.; Matthew B. Talpis

(57) ABSTRACT

Mechanisms are provided for controlling a fidelity of a simulation of a system. A model of the system is received, the model of the system having a plurality of individual components of the system. Fidelity values are assigned to models of the individual components of the system. A required fidelity value is assigned to transactions between components in the plurality of individual components of the system. A simulation of the system is executed using the model of the system and the models of the individual components of the system. The fidelity values of one or more of the models of the individual components of the system are dynamically adjusted during the execution of the simulation based on the required fidelity values assigned to the transactions.

24 Claims, 13 Drawing Sheets

OTHER PUBLICATIONS

D'Aspremont, Alexandre et al., "Optimal Solutions for Sparse Principal Component Analysis", Journal of Machine Learning Research 9, 2008, pp. 1269-1294.

Kingsley, Gerry et al., "Development of a Multi-Disciplinary Computing Environment (MDICE)", Abstract, NASA Lewis Research Center, STAR, v 37, Apr. 26, 1999, 2 pages.

Koyuncu, Nurcin et al., "DDDAS-Based Multi-Fidelity Simulation for Online Preventive Maintenance Scheduling in Semiconductor Supply Chain", IEEE, 2007, pp. 1915-1923.

Lada, Emily K. et al., "Introduction to Modeling and Generating Probabilistic Input Processes for Simulation", Proceedings of the 2005 Winter Simulation Conference, 2005, pp. 41-55.

Niemela, Eila et al., "Survey of Requirements and Solutions for Ubiquitous Software", Mobile Ubiquitous Computing Conference '04, Oct. 2004, ACM, pp. 71-78.

Pachidis, Vassilios et al., "A Fully Integrated Approach to Component Zooming Using Computational Fluid Dynamics", Journal of Engineering for Gas Turbines and Power, vol. 128, ASME, Jul. 2006, pp. 579-584.

Pillai, Padmanabhan et al., "Multi-Fidelity Storage", ACM, VSSN '04, Oct. 15, 2004, pp. 72-79.

Rao, Dhananjai M. et al., "Multi-resolution Network Simulations using Dynamic Component Substitution", IEEE 2001, pp. 142-149.

Schricker, Bradley C. et al., "Using the High Level Architecture to Implement Selective-Fidelity", IEEE, Proceedings of the 37th Annual Simulation Symposium (ANSS'04), 2004, 8 pages.

Alexandrov, Natalia M., "Variable-Fidelity Models in Optimization of Simulation-Based Systems", NASA Langley Research Center, Mar. 2002, 41 pages.

Gano, Shawn E., "Simulation-Based Design Using Variable Fidelity Optimization", Graduate Program in Aerospace and Mechanical Engineering, Notre Dame, Indiana, Apr. 2005, 182 pages.

Mejia-Rodriguez, Gilberto et al., "A Variable Fidelity Model Management Framework for Designing Multiphase Materials", ASME, Sep. 2008, vol. 130, 13 pages.

Grobelny, Eric et al., "FASE: A Framework for Scalable Performance Prediction of HPC Systems and Applications", Simulation, vol. 83, Issue 10, Oct. 2007, pp. 721-745.

Wu, Haigang et al., "Dynamic Multi-Resolution Modeling of Power Super Capacitor", IEEE, Proceedings of the 37th Annual North American Power Symposium, 2005, pp. 241-246.

* cited by examiner

DYNAMICALLY ADJUSTING SIMULATION FIDELITY IN A SELF-OPTIMIZED SIMULATION OF A COMPLEX SYSTEM

BACKGROUND

The present application relates generally to an improved data processing apparatus and method and more specifically to mechanisms for dynamically adjusting simulation fidelity in a self-optimized simulation of a complex system, such as a computer system for example.

As today's computing systems become larger and more complex to meet the increased demands for computing resources, simulation of such computer systems has become more important. Such simulation allows individuals to obtain information regarding the operational characteristics of the computing system that may assist individuals in determining how to configure the system to achieve optimal performance as well as address performance issues in the computing system. This software simulation of complex computer systems has become a critical part of the development process for any large system.

Users of such software simulations of complex computer systems typically must make an explicit and manual determination of a tradeoff between simulation speed, or performance, and simulation accuracy, or "fidelity", for a given complex computer system. "Fidelity" is the accuracy of the simulation compared to the real world system being modeled. Performance is the amount of time it takes to complete the simulation.

Generally, high fidelity simulation models have an adverse impact on performance of the simulation. That is highly accurate or high fidelity simulation models typically take a relatively longer amount of time to complete the simulation whereas less accurate or lower fidelity simulation models take a relatively shorter amount of time to complete the simulation. Sometimes greater fidelity is desirable and other times greater performance is desirable. It is left to the simulation administrators to choose the appropriate models and configure them to achieve the overall desired performance and fidelity.

SUMMARY

In one illustrative embodiment, a method, in a data processing system, is provided for controlling a fidelity of a simulation of a system. The method comprises receiving a model of the system. The model of the system comprises a plurality individual components of the system. The method further comprises generating a representation of the plurality of individual components of the system. In addition, the method comprises assigning a component in the plurality of individual components to be a fidelity center. The fidelity center has a highest possible associated fidelity value. The method also comprises assigning a fidelity value to each other component in the plurality of individual components based on an affinity of the other component to the fidelity center. Moreover, the method comprises simulating the system based on assigned fidelity values to the components in the plurality of individual components.

In another illustrative embodiment, a method, in a data processing system, for controlling a fidelity of a simulation of a system is provided that comprises receiving the model of the system, where the model of the system comprises a plurality of individual components of the system, and assigning fidelity values to models of the individual components of the system. The method further comprises executing a simulation of the system using the model of the system and the models of the individual components of the system. Moreover, the method comprises dynamically adjusting fidelity values of one or more of the models of the individual components of the system during the execution of the simulation. Such dynamic adjustment may be based on fidelity based on the required fidelity values assigned to the transactions, based on changes in individual activity levels of the individual components, based on a checkpoint of a state of the simulation with regard to fidelity values, or the like.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
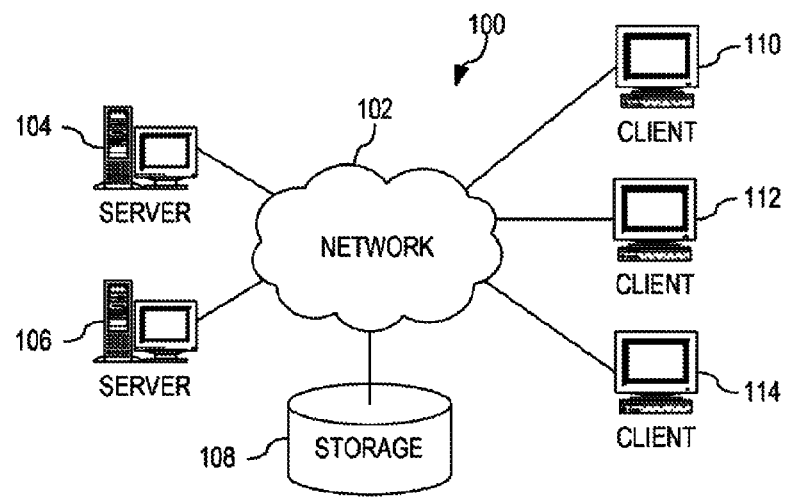
FIG. 1 is an example diagram of a distributed data processing system in which aspects of the illustrative embodiments may be implemented.

The illustrative embodiments provide a mechanism for determining simulation fidelity in a self-optimized simulation of a complex system, such as a computer system. That is, the illustrative embodiments provide mechanisms for assigning fidelity measures to each of the components of a simulation model for a computer system. In this way, fidelity measures may be balanced across the simulation model so as to achieve the desired fidelity for each of the individual portions of the simulation model and the simulation model as a whole, while providing a highest possible performance of the simulation model as a whole. The fidelity of the simulation model is not simply assignable from a whole simulation model approach, but rather can be customized on an individual simulation model component basis.

The illustrative embodiments further provide mechanisms for determining how to assign fidelity measures to each of the components of a simulation model so as to achieve the most desirable balance between performance and fidelity. At one extreme, all the components of the simulation model may be run at the slowest performance level with the highest fidelity, or at the other extreme may be run at a highest performance level with a lowest fidelity. Either of these extremes, however, will not suffice in achieving the optimum performance of the simulation model.

The mechanisms of the illustrative embodiments use a component centric methodology for determining the fidelities of components of a simulation system. The component centric methodology provides a systematic way of identifying the fidelity level of every component in the simulation model so as to achieve a maximum performance while maintaining the required accuracy, or "fidelity."

With the component centric methodology, fidelities are assigned to components of the simulation model based on their affinity to "fidelity centers." The fidelity centers are components in the simulated system, i.e. the simulation model, which are determined to need to run at a highest fidelity setting. These are components that have the most relative importance to the outcome of the overall simulation at the moment of evaluation. All other components in the simulated system will run at lower fidelities as their affinities to the fidelity centers decreases. That is, as the logical or physical affinity between a component and a fidelity center increases, the fidelity of the component decreases. This methodology for determining component fidelity allows some designated components to satisfy requirements of higher accuracy, or fidelity, while components with less affinity to these fidelity centers will sacrifice accuracy for increased performance of the simulation. This tradeoff is acceptable because it is assumed that as the affinity decreases, the particular component has a lower impact on the overall accuracy of the simulation model.

In addition to the above, the mechanisms of the illustrative embodiments further provide logic and functionality for dynamically determining and changing fidelity values, or levels, as a simulation of the system executes. In this way, the simulation may be fine tuned so as to achieve a highest possible performance while maintaining a required level of fidelity or accuracy. This dynamic determination and changing of fidelity values may be achieved in a number of different ways including using a transaction centric methodology, an activity centric methodology, and/or a correction methodology. With the transaction centric methodology, transactions are guaranteed to be handled by a model have a required fidelity value, however the component of the computer system originating the transaction must know what level of fidelity the transaction requires. With the activity centric methodology, components may have their performance dynamically increased when the component's activity starts to wane, i.e. as the component becomes less active during the simulation, the fidelity level required from the simulation of the component is less and as a result, the performance of the overall simulation is increased. With the correction methodology, the fidelity of a given component is predicted by checkpointing and selecting a lower fidelity value for a given model, detecting a fidelity mismatches if any, and restoring the model of the component to an earlier valid checkpoint and resuming execution at a higher fidelity in response to a fidelity mismatch. Each of these methodologies will be described in greater detail hereafter.

As a further improvement, illustrative embodiments may further utilize a predictive mechanism for determining a priori what a fidelity value for a component should be during the simulation based on a history of fidelity values. Specifically, the actual transaction run time fidelity in the simulation and the requested fidelity for a transaction are monitored and adjustments to increase/decrease the fidelity of the model in the simulation to match the requested fidelity are tracked. Trend values are calculated based on these tracked increase/decreases and the trend values are used to determine when and by how much the fidelity value of a model of a component in the model of the computer system is to be modified so as to anticipate the fidelity value that will be required by future transactions. This will avoid the performance impact of having to change the fidelity of model during simulation runtime by predicting the needed fidelity prior to the need.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
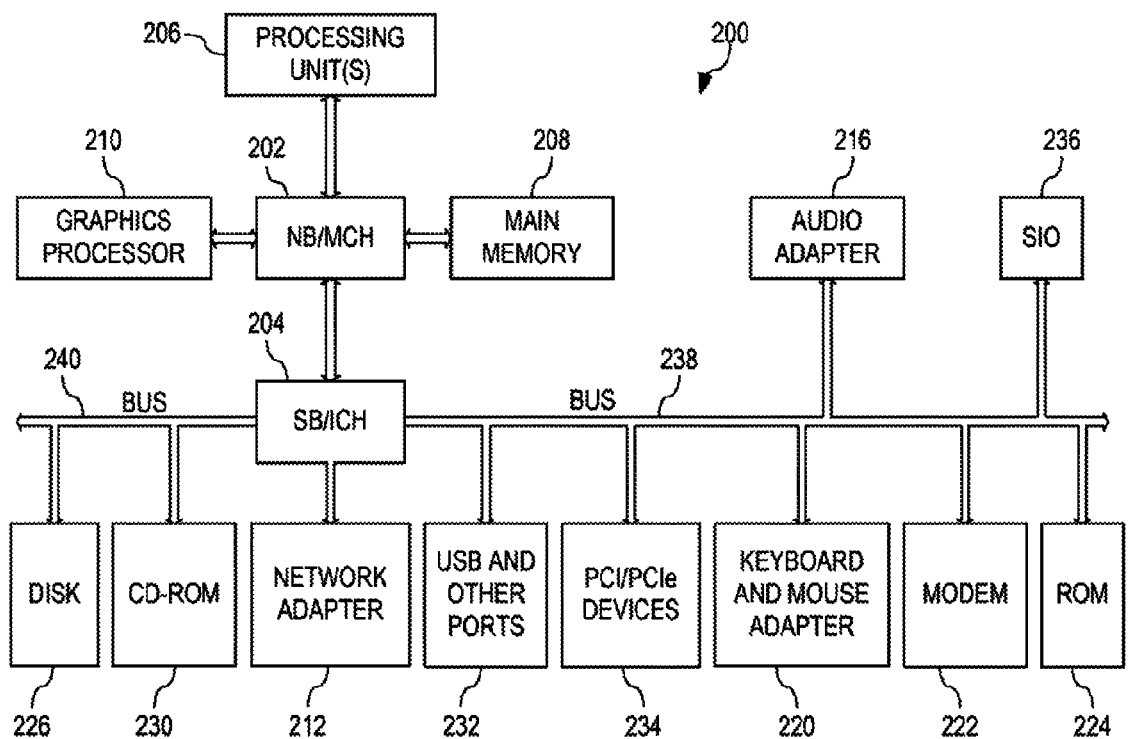
FIG. 2 is a block diagram of an example data processing system is shown in which aspects of the illustrative embodiments may be implemented.

The illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIU) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

As mentioned above, the mechanisms of the illustrative embodiments are generally directed to simulation of complex computer systems. As such, this simulation may be performed either on a single computing device, such as a client computer device or a stand-alone computing device, or by a plurality of computing devices operating together. For example, a server computing device, such as server 104 or 106 in FIG. 1, may provide the facilities to implement a simulation of a complex computer system using the mechanisms of the illustrative embodiments, but with user interaction being provided either directly at the server computing device or remotely via one or more client computing devices, such as client computing devices 110-114, and one or more data networks, such as data network 102. Moreover, multiple server computing devices may work in concert to achieve the simulation of the complex computer system and thus, various components of the simulation, as well as the illustrative embodiments, may be distributed across a plurality of computing, or data processing, devices/systems. For ease of explanation, however, it will be assumed that the simulation mechanisms as well as the mechanisms of the illustrative embodiments are implemented in a single server computing device, with or without user interaction from one or more client computing devices.

The illustrative embodiments provide mechanisms for determining, for each component of a model of a computing system, a fidelity measure for the component. A component of a model of a computing system may comprise a sub-portion of the model of the computing system that is directed to modeling an individual hardware and/or software component of the computing system. For example, a component may be a processor, a storage device, a bus, an application-specific accelerator card (such as an encryption co-processor or the like), power supply, voltage regulator, a baseboard management controller, service processor, programmable logic devices, thermal sensors, other types of sensors, a service application, an operating system, or the like. The sub-portions may be individual component models, routines for modeling the components, classes and methods for modeling the components, or the like.

The fidelity of these components refers to the accuracy of the modeling of the component when compared to the actual operation of a real implementation of the component. The fidelity may be measured as the precision with which the component is modeled by the sub-portions of the model of the computing system. Using a higher precision provides a higher fidelity, in general. Thus, for example, the various models of the components may be set to have different fidelities by setting various precision settings of the models. For example, a model of one component may be set to use double precision floating point values (more precise and higher fidelity, but slower to execute) while another model of a component may be set to round to a nearest integer (less precise and lower fidelity, but faster to execute), one could choose between a "behavioral" model that may be less precise and a "real" model that may be more precise, one may choose between a simple model versus a complex model where fewer components or more components of the computer system are modeled within the respective models, one could choose between a thermal sensor responder providing a preprogrammed temperature value versus a thermal sensor emulator that calculates temperature based on other factors in the simulation, or the like.

The illustrative embodiments provide a mechanism for assigning fidelity values to various components within a model of a computing system. When it said that the fidelity values are assigned to the components, what is meant is that the corresponding model of the component is assigned a fidelity value parameter which is used as a basis for setting an amount of precision with which the model of the component is executed. The actual fidelity value may take many different forms depending on the desired implementation. For example, a fidelity value may be one of a "high", "medium", or "low" value. Moreover, fidelity values may have numeric values within a defined range of fidelity values. Based on these fidelity values, the modeling system may determine what precision parameters to pass to the models of the components to control the precision of the models of the components. For example, if a model of a component is assigned a fidelity value of "high", a precision parameter may be passed or set with regard to the model of the component that instructs the model of the component to use double precision floating point values. If a model of a component is assigned a fidelity value of "low", a precision parameter may be passed or set with regard to the model of the component that instructs the model of the component to use integer values.

With regard to the illustrative embodiments herein, a component centric fidelity engine is utilized that assigns fidelity values to models of components based on the designation of fidelity centers and the affinity of components of the computing system with these designated fidelity centers. The models of components of the computing system, in the model of the computing system, that are designated as fidelity centers are executed with a highest allowable fidelity, i.e. are assigned a highest possible fidelity value. The fidelity centers may be determined either manually by a user and input to the modeling system for use in performing the component centric methodology. Alternatively, an automated mechanism may analyze the model of the computing system to identify the components of the computing system, their interconnections, potential utilization, operational interaction between components, and the like. The fidelity centers may be determined based on such analysis. For example, based on a number of connections between given components and other components, processor utilization by the component, number of transactions to/from the component, or the like, certain components having high measures of these values, e.g., values above a predetermined threshold or thresholds, may be determined to be fidelity centers. The automated mechanisms may be used along with user input in some illustrative embodiments such that the automated mechanisms provide a recommendation for fidelity centers while allowing a user to override such recommendations and either select additional components as fidelity centers, removed components as fidelity centers, and the like.

Once one or more fidelity centers for a model of a computer system are defined, a highest fidelity value is associated with these components, or the models of these components. Other components of the model of the computer system are assigned fidelity values based on their affinity to the one or more fidelity centers. Components having a higher affinity to the fidelity centers are assigned a relatively higher fidelity value than components that have a lower affinity to the fidelity centers. The affinity to a fidelity center describes the relative "closeness" of a component to another component that is a fidelity center. "Closeness" may be measured both in terms of physical closeness (e.g., direct or indirect physical links between the components, lengths of such connections, etc.) as well as logical closeness (e.g., numbers of transactions between the components, etc.). The affinity itself may be determined by any suitable method including, but not limited to, methods that operated based on determining the affinity based on connectivity to fidelity centers or to other models with high affinity to fidelity centers, based on type or number of transactions with fidelity centers or to other models with high affinity to the fidelity centers, based on user specification of affinity, or any other suitable method.

Based on the fidelity values of the various models of components within the model of the computing system, the modeling system is used by a simulation engine to simulate the operation of the computing system. In using the modeling system, parameters or settings are set for the various models of components based on the fidelity values associated with them. For example, a parameter or setting may be set to indicate that double precision floating point values are to be utilized for the fidelity centers, a parameter or setting may be set to indicate that single precision floating point values are to be used for components in a next closest portion of the model to the fidelity centers, and integer values are to be used for components further out from the fidelity centers with regard to affinity. As a result, those components that are not deemed to be as critical to the accuracy of the overall simulation are given lower fidelity and precision settings so that the increased performance when modeling these components adds to the performance of the overall simulation. Those components that are deemed to be more critical to the overall accuracy of the simulation, i.e. those components that are fidelity centers or have a high affinity to the fidelity centers, are given a higher fidelity and precision setting so that they may detract from the overall performance of the simulation, but greatly increase the accuracy of the overall simulation. The loss in performance due to the increased fidelity and precision of these fidelity centers and high affinity components may be at least partially compensated for by the increased performance of the modeling of the other components as mentioned above.

In order to use the component centric methodology for assigning fidelity values to components of a model of a computer system, a representation of the model of the computer system is first generated. In one illustrative embodiment, this representation of the model of the computer system comprises a mesh of nodes and links between nodes, where each node represents a component in the model of the computer system, i.e. each node is a model of a component or a subportion of the model of the computer system directed to modeling a particular component of the computer system. The links between nodes in the mesh represent the connections between components, e.g., relationships, interactions, physical connects, etc.

Figure 3A:
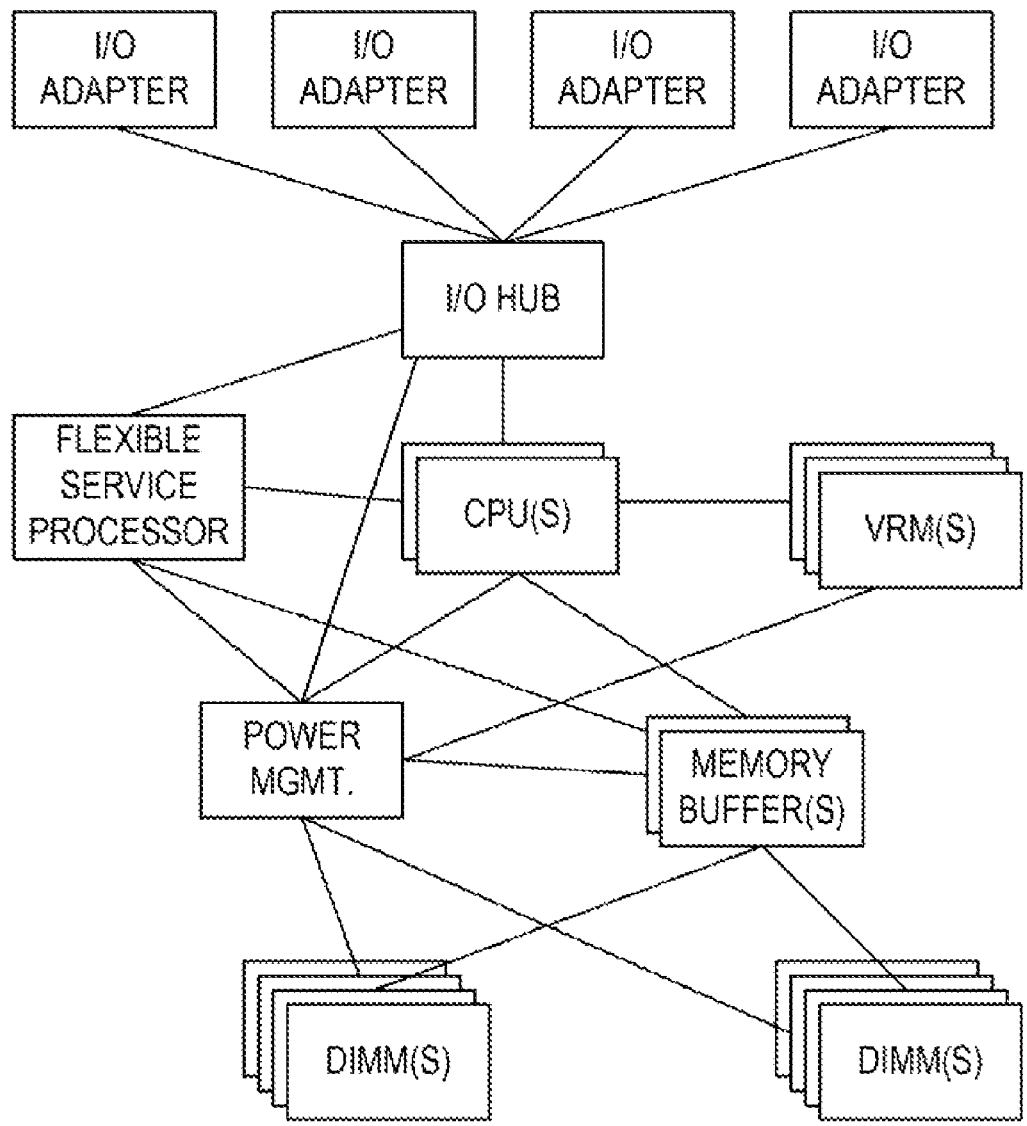
FIG. 3A illustrates an example block diagram of a computing system in accordance with one illustrative embodiment.

FIG. 3A illustrates an example block diagram of a computing system in accordance with one illustrative embodiment. The example shown in FIG. 3A is for a high end server computing system, but the mechanisms of the illustrative embodiments may be used with any type of computing system. The existence and connections between components of the computing system may be automatically discovered or identified by analyzing the model of the computer system and identifying portions of the model of the computer system directed to each separate component of the computer system, for example. Alternatively, a user may specify the components and their connections or a combination of the automated and manual process for specifying the computer system components and connections may be utilized. As further examples of component identification methodologies, a simulation may be arbitrarily componentized based on resource consumption of the component (memory, disk, program size of the simulation) or a simulated system may be componentized based on the plugability of its real hardware counterparts. In other words, if the real hardware can be plugged into a slot or a socket, then it would be considered a component.

Figure 3B:
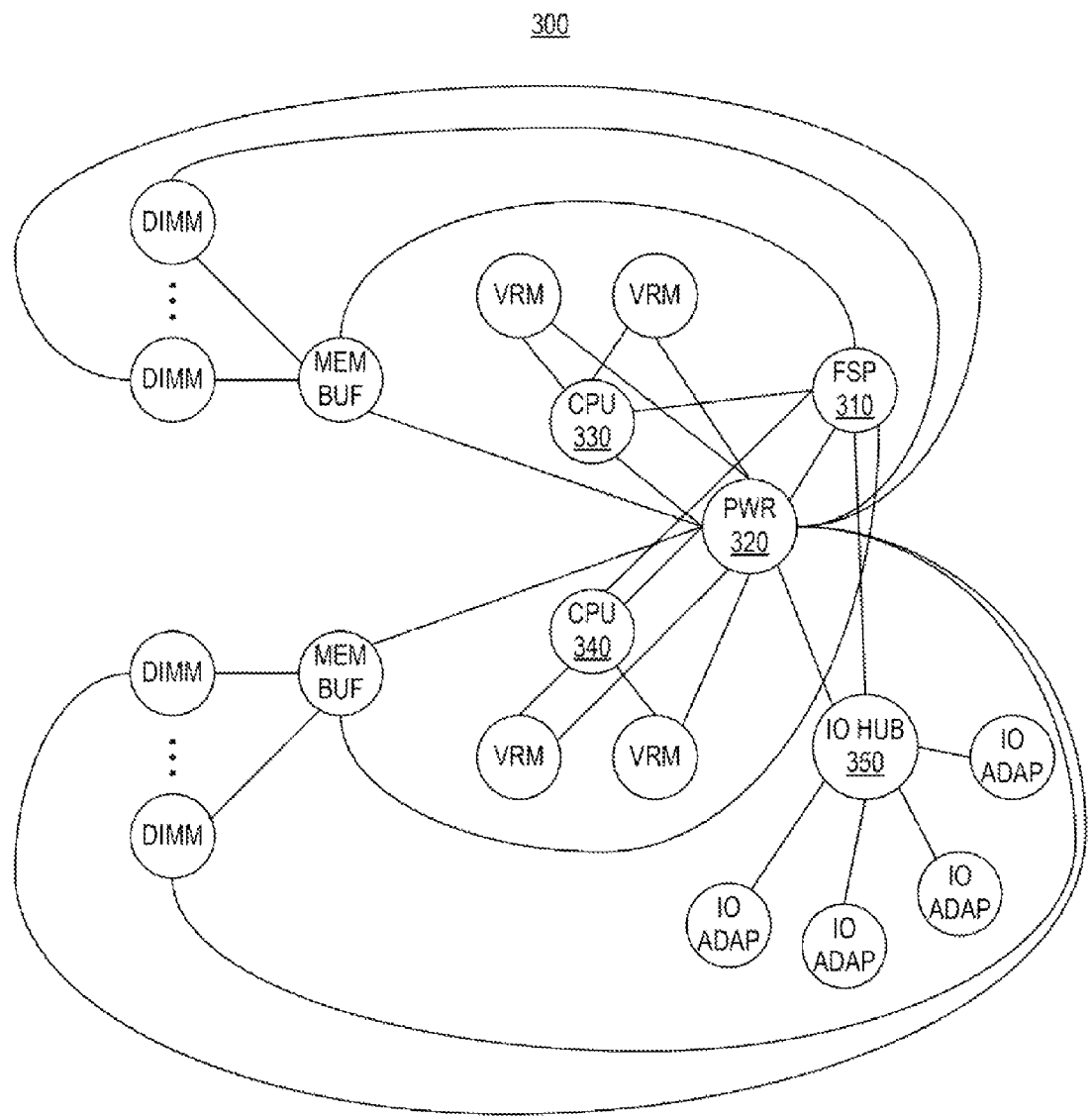
FIG. 3B is an example diagram of a nodal mesh representation of the computer system shown in FIG. 3A which may be used as a basis for assigning fidelity values in accordance with one illustrative embodiment.

FIG. 3B is an example diagram of a nodal mesh representation of the computer system shown in FIG. 3A which may be used as a basis for assigning fidelity values in accordance with one illustrative embodiment. The nodal mesh 300 of FIG. 3B may be generated by analyzing the discovered components and their links in FIG. 3A and generating the nodal mesh with nodes representing each component and links between nodes representing the connections between the components.

Based on this nodal mesh 300, certain ones of the nodes may be selected as fidelity centers. As mentioned above, the selection of nodes, or components, as fidelity centers may be performed through an automated analysis of the nodal mesh 300, a manual user specification of the fidelity centers, or a combination of automated and manual processes for identifying certain ones of the nodes as fidelity centers. At least one fidelity center must be specified for the component centric methodology to be utilized in assigning fidelity values to nodes of the nodal mesh 300.

As shown in FIG. 3B, in the depicted example, node 310, corresponding to the flexible service processor (FSP), has been determined to be a fidelity center. Node 310 may have been selected by an automated process, a manual process, or a combination of automated process and manual process, as mentioned above. For example, the FSP node 310 may have been selected because of a number of transactions between the FSP node 310 and the power management node 320, processors 330-340, and the I/O hub 350. That is, the FSP node 310 may be very active in the operation of the overall computer system and thus, may have been selected as a fidelity center since accuracy of its modeling will greatly affect the accuracy of the overall simulation of the computer system represented by the nodal mesh 300. As a result, node 310 is given a highest possible fidelity value and the simulation of node 310 will be executed with a highest precision.

Figure 3C:
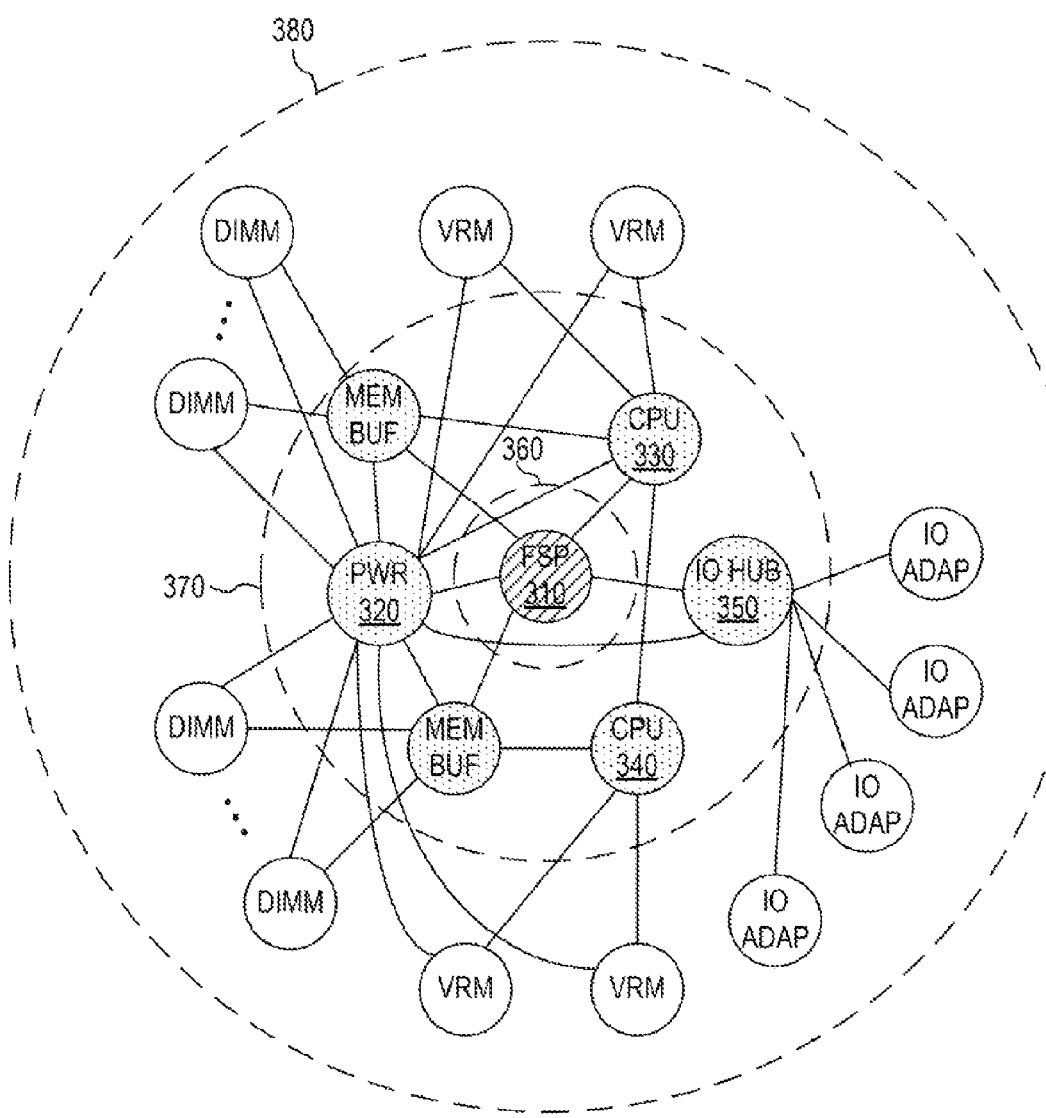
FIG. 3C illustrates one example way in which fidelity values may be assigned to nodes in nodal mesh in accordance with one illustrative embodiment.

Once at least one fidelity center is selected, such as node 310, the remaining nodes in the nodal mesh 300 are assigned fidelity values based on their affinity to the fidelity centers, e.g., node 310. FIG. 3C illustrates one example way in which fidelity values may be assigned to nodes in nodal mesh 300 in accordance with one illustrative embodiment.

As shown in FIG. 3C, three concentric circles 360-380 are generated with the fidelity center node 310 being at the center of these concentric circles 360-380. The nodes within the inner most circle 360 represent fidelity centers. In this case, there is only one fidelity center node 310 but other sets of concentric circles may be utilized for other fidelity centers should more than one fidelity center be identified. Nodes within the next outer circle 370 represent nodes that have a high affinity to the fidelity center nodes in circle 360. Nodes in the outer most circle 380 represent nodes that have a relatively low affinity to the fidelity center nodes in circle 360. These affinities, as mentioned above, may be determined based on a number of factors including both physical and logical connections between the components represented by the nodes and the fidelity center components.

It should be appreciated that the various zones represented by circles in FIG. 3C are only examples and the illustrative embodiments are not limited to the particular number of zones (or circles) or the particular configuration of the zones shown in FIG. 3C. Any number of zones and configurations of zones may be used without departing from the spirit and scope of the illustrative embodiments.

For ease of explanation, in the depicted example, affinity is based only on direct/indirect connection of components with the fidelity center, i.e. the FSP component. As can be seen in FIG. 3A, the CPUs, Memory Buffers, Power Management, and I/O hub components have direct connections to the FSP while other components have an indirect connection, i.e. they are connected to the FSP through other components. As a result, in the depicted example, the CPUs, Memory Buffers, Power Management, and I/O hub components have a high affinity with the fidelity center FSP node 310, whereas the remaining I/O adapter, voltage regulator module (VRM), and dual in-line memory module (DIMM) nodes have a relatively low affinity with the fidelity center FSP node 310.

The information regarding affinity may be obtained from an analysis of the model of the computer system to identify which components are directly connected to each other and which components are indirectly connected to each other. Similar analysis could be done for logical connections in another embodiment in which both physical and logical affinity are considered. A weighting algorithm may be used to weight the links between components or nodes in the nodal mesh 300 according to any of a number of different factors for the purposes of determining affinity between nodes. For example, higher weights can be given to links between processor type components and bus or hub components, lower weights can be given to memory components, or the like. Weights may also be assigned to links based on activity, transaction type, link type, or the like. Thus, based on the weighting, some nodes that would otherwise be considered to have a high affinity, may in fact have a lower affinity, e.g., not all connections to CPUs may be weighted the same and thus, some CPUs may be in a relatively high affinity region of the nodal mesh 300 whereas others are in a medium or even low affinity region of the nodal mesh 300.

Figure 3D:
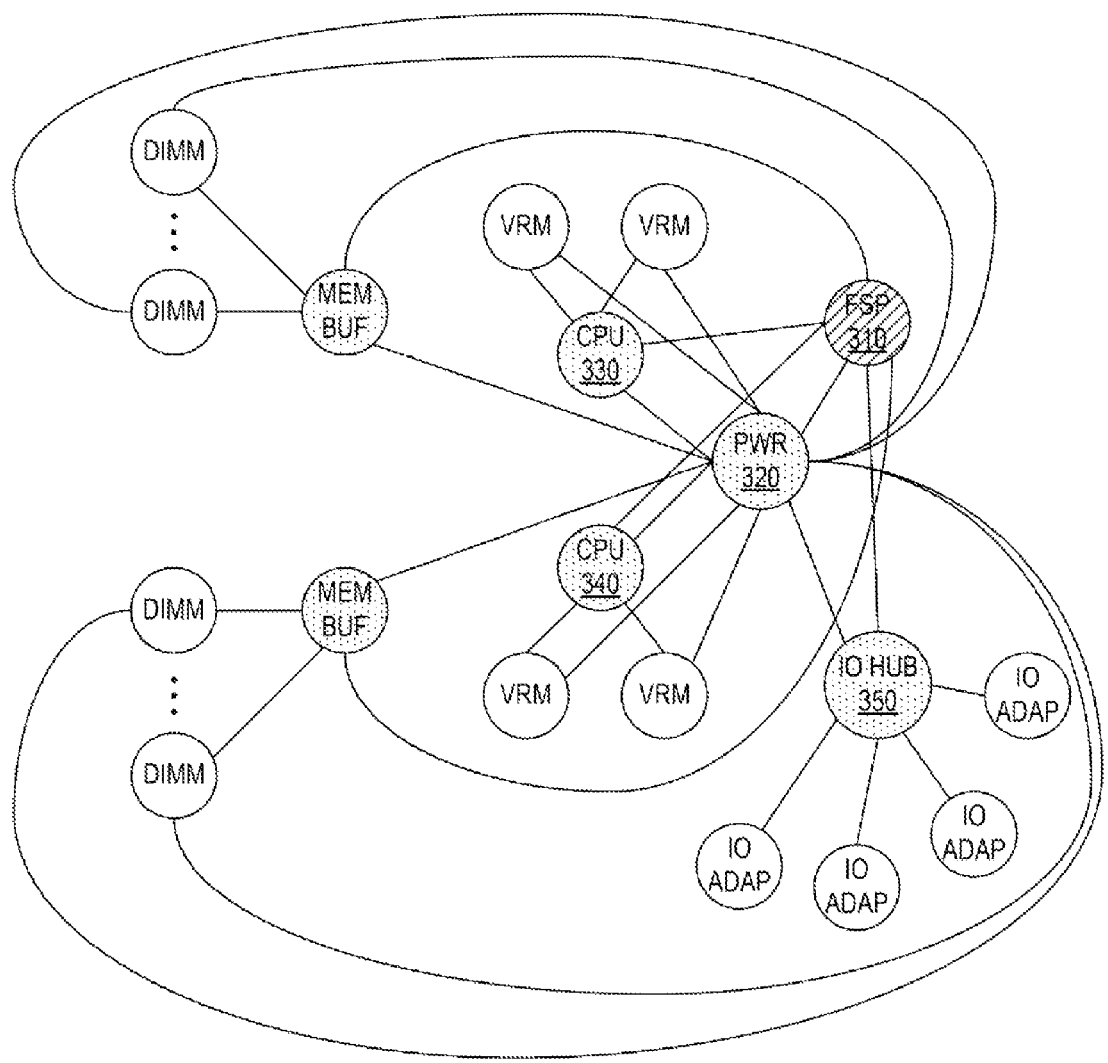
FIG. 3D is an example of a mapping of fidelity values corresponding to the assignment shown in FIG. 3C, in accordance with one illustrative embodiment.

As a result of this analysis, the mapping of fidelity values as shown in FIG. 3D is determined. A "high" fidelity value may be assigned to any nodes within the circle 360, i.e. the FSP node 310, a "medium" fidelity value may be assigned to nodes in the circle 370, i.e. CPU, Memory Buffer, Power Management, and I/O hub nodes, and a "low" fidelity value may be assigned to nodes in the circle 380, i.e. the I/O adapter, VRM, and DIMM nodes. These fidelity values may then be used to set parameters or setting values for specifying the precision at which the simulation of the corresponding components, using the models of these components, is performed.

The above methodology for assigning fidelity values using the component centric approach may be performed at various times during the simulation of the computer system using the model of the computer system. For example, fidelity processing and assignment such as that described above may be performed when the simulation of the computer system starts, when a concurrent maintenance event occurs, e.g., a configuration change to the computer system such as a hot plugging of a component, removal of a component, or the like, the fidelity of a fidelity center changes due to user interaction or the like, at a user defined point in time during the simulation, or at other event-based or user defined times during the simulation of the computer system.

It should be appreciated that the example above only shows one fidelity center but in actuality, a plurality of fidelity centers may be defined in a model of a computer system. As a result, some components of the computer system will have greater affinities to one fidelity center and lower affinities to another fidelity center, with overlaps between these measures of affinity between the different fidelity centers. The weighting algorithm discussed above may be utilized to determine a final fidelity value to be assigned to a node that is present in overlapping regions of affinity between two or more fidelity centers by weighting the different connections differently and then using any suitable logic to determine what the final affinity and fidelity measure should be for the node. For example, an average of the affinities may be generated and used as a basis for determining the fidelity value to assign to the node. Other functions can be used to determine the final fidelity value in accordance with the particular implementation desired. Such functions may be statistical functions or other mathematical functions for deriving a single fidelity value from the various affinities of the node. Alternatively, a user may be informed of this situation and requested to select or enter an affinity for the node upon which the fidelity value may be based. Any suitable function or manner for specifying the affinity of a node when the node has affinities to multiple fidelity centers may be used without departing from the spirit and scope of the illustrative embodiments.

Thus, the illustrative embodiments provide mechanisms for assigning fidelity values to components of a computer system being simulated using a model of the computer system. The mechanisms use a component centric methodology to assign these fidelity values. The component centric methodology involves defining fidelity centers as having a highest fidelity value, and then assigning lower fidelity values to other components of the computer system based on their affinity to the defined fidelity centers. In this way, a balance between precision of the simulation of the computer system and performance of the simulation of the computer system is achieved by assigning higher fidelities to the more critical components of the model of the computer system and lower fidelities to the less critical components of the model of the computer system.

Figure 4:
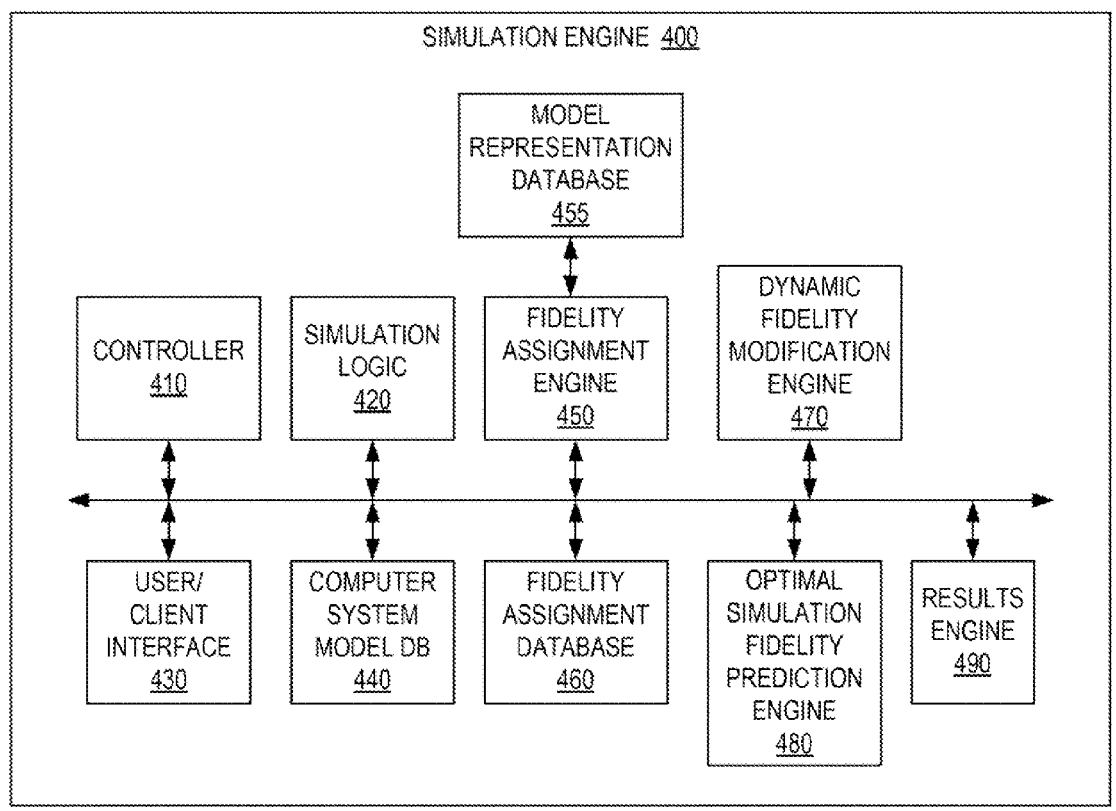
FIG. 4 is an example block diagram of the primary operational components of a simulation engine in accordance with one illustrative embodiment.

FIG. 4 is an example block diagram of the primary operational components of a simulation engine in accordance with one illustrative embodiment. The simulation engine 400 in FIG. 4 may be implemented in hardware, software, or any combination of hardware and software in one or more computing devices. For example, in one illustrative embodiment, the simulation engine 400 is implemented as software instructions executing on one or more processors of a server computing device, such as server 104 or 106 in FIG. 1.

As shown in FIG. 4, the simulation engine 400 comprises a controller 410, simulation logic 420, user/client device interface 430, computer system model database 440, fidelity assignment engine 450, fidelity assignment database 460, dynamic fidelity modification engine 470, optimal simulation fidelity prediction engine 480, and results generation, storage, and presentation engine 490. The controller 410 comprises logic for controlling the overall operation of the simulation engine 400 and orchestrates the operation and interaction of the other elements 420-490. The simulation logic 420 controls and performs the actual execution of the simulation of the computer system using the computer system model database 440. The computer system model database 440 stores the model of the computer system including any sub-portions, or models, of the individual components of the computer system. For example, the model of the computer system may be comprised of instantiations of classes, i.e. objects, representing the various components of the computer system and the simulation logic 420 may execute a simulation of the computer system using the objects in the computer system model database 440.

The simulation logic 420 may execute the simulation of the computer system using the model in the database 440 based on fidelity values associated with the various components in the model of the computer system as determined by the mechanisms of the illustrative embodiments. For example, the fidelity assignment engine 450 may analyze the model of the computer system in the database 440 and determine the physical and/or logical connections between the components of the computer system in the model, such as shown in FIG. 3A above. The fidelity assignment engine 450 may then generate a representation of the components and their physical/logical connections, such as the nodal mesh shown in FIG. 3B above, for example. This information may be stored in a computer system representation data structure 455 for continued use by the fidelity assignment engine 450 so that the representations need not be regenerated each time a change in fidelity assignments is determined to be necessary.

Having generated a representation of the components and their physical/logical connections in the computer system, the fidelity assignment engine 450 identifies fidelity centers within the representation. The determination of fidelity centers may be performed automatically using analysis of the representation, e.g., components having a number of physical/logical connections greater than a predetermined threshold may be considered fidelity centers, components having direct physical/logical connections may be considered fidelity centers, or the like. In addition, or alternatively, user input may be received, either directly or via client computing devices, through user/client device interface 430, for specifying fidelity centers.

Once one or more fidelity centers are defined, the fidelity assignment engine 450 may assign fidelity values to the other components of the model of the computer system using a component centric methodology as described above. The resulting fidelity values assigned to the various components may then be stored in a fidelity assignment database 460 for use by the simulation logic 420 in determining how to execute the various sub-portions of the computer system model 440, associated with the components of the computer system, to achieve a balance between fidelity and performance of the simulation. The results of the simulation may be compiled by the results engine 490, stored, and/or presented to a user via the user/client interface 430.

The dynamic fidelity modification engine 470 and optimal simulation fidelity prediction engine 480 provide logic for performing additional functionality provided by the mechanisms of the illustrative embodiments. As will be described in greater detail hereafter, the dynamic fidelity modification engine 470 may operate to perform one or more different methodologies for dynamically adjusting fidelity values of components of the model of the computer system. Moreover, the optimal simulation fidelity prediction engine 480 may be used to look at trend information for changes in fidelity values of components to predict the dynamic updates to fidelity values for components of the model of the computer system during simulation of the computer system. These additional mechanisms will be described in greater detail hereafter.

Figure 5:
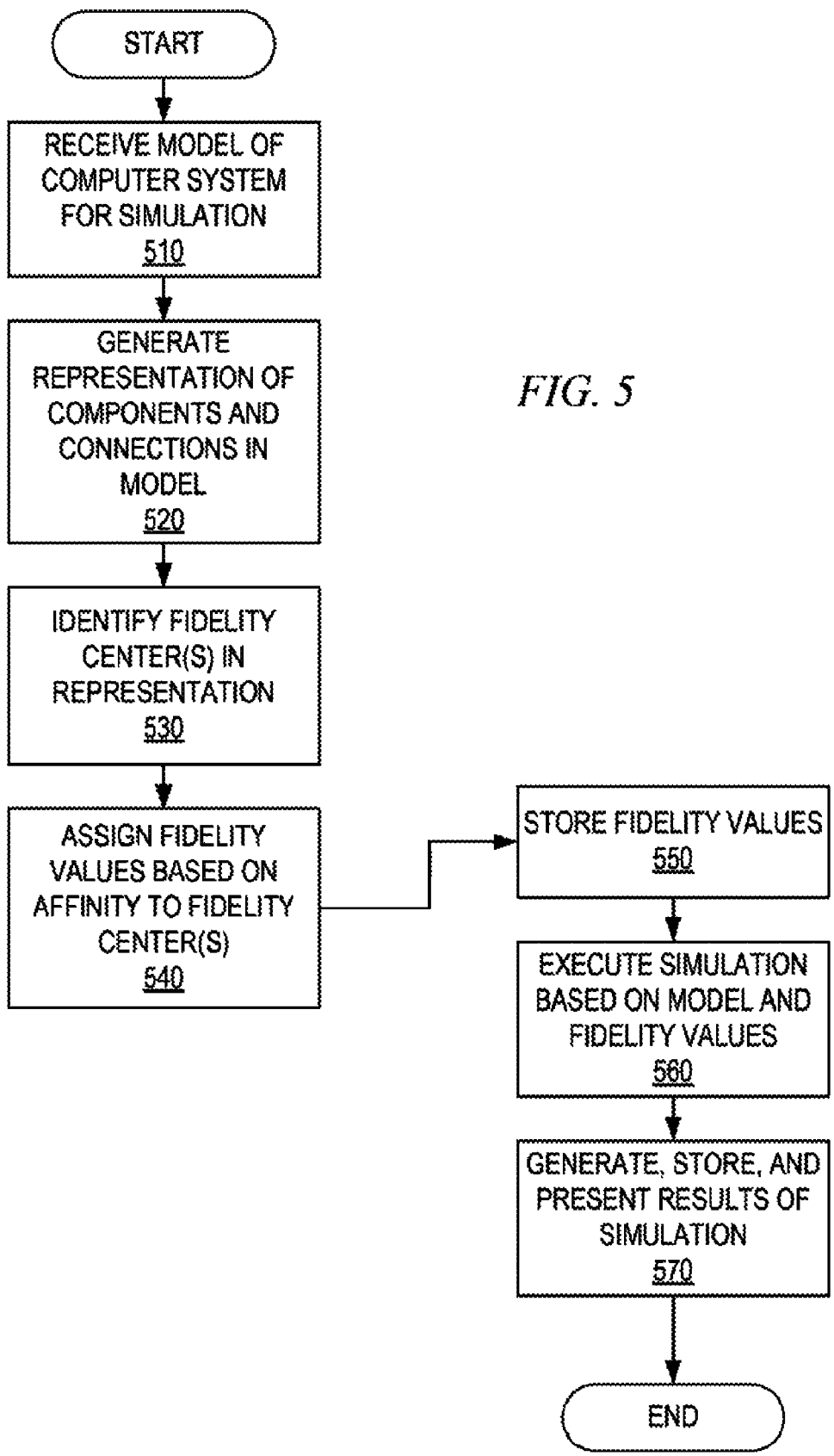
FIG. 5 is a flowchart outlining an example operation for performing this fidelity assignment in accordance with one illustrative embodiment.

Each of these additional mechanisms may utilize the fidelity assignment engine 450 as a basis for defining an initial set of fidelity values to the components of the model of the computer system with dynamic modifications thereafter. FIG. 5 is a flowchart outlining an example operation for performing this fidelity assignment in accordance with one illustrative embodiment. The operation outlined in FIG. 5 may be performed, for example, by the fidelity assignment engine 450 in FIG. 4 or other type of hardware and/or software logic for performing fidelity assignments.

As shown in FIG. 5, the operation starts with receiving a model of a computer system that is to be used for simulating the computer system (step 510). The model of the computer system includes sub-portions or individual models of individual components of the computer system. A representation of the plurality of individual components of the computer system is generated based on at least one of physical or logical connections between the individual components (step 520). One or more fidelity centers are then identified based on the representation of the components (step 530). Fidelity values are then assigned to other components in the model of the computer system based on their affinity to the fidelity center(s) (step 540). This information is then stored (step 550) and a simulation of the computer system is performed using the model of the computer system and the associated fidelity values of the various components of the model of the computer system (step 560). Results of the simulation are stored and optionally presented to a user for use in determining how the computer system will operate (step 570). The operation then terminates.

It should be noted that while the above illustrative embodiments are described in terms of setting a fidelity value for the particular models of the components within the model of the computer system, the invention is not limited to such. Rather, any other mechanism for specifying or setting the fidelity of a model of a component may be used without departing from the spirit and scope of the illustrative embodiments. For example, in some illustrative embodiments, each component of the computer system may have more than one model of that component that may be utilized depending upon the fidelity value associated with the component. As an example, a FSP may have a first model for a "low" fidelity value that uses integer values to simulate the FSP, a second model for a "medium" fidelity value that uses single precision floating point values to simulate the FSP, and a third model for a "high" fidelity value that uses double precision floating point values to simulate the FSP. Based on the fidelity value assigned to the FSP component using the mechanisms described above, the particular corresponding model may be selected and enabled for use in the simulation. The use of multiple models and the selection of an appropriate model may be further used for dynamic adjustment of the fidelity values of the components of the computer system as will be described in greater detail hereafter.

As mentioned above, in addition to the mechanisms for assigning fidelity values to components of a model of a computer system based on affinities between these components and fidelity centers, additional mechanisms are provided for dynamically modifying these fidelity values as the simulation progresses. In this way, the simulation may be fine tuned so as to achieve a highest possible performance while maintaining a required level of fidelity or accuracy. As mentioned above, this dynamic determination and changing of fidelity values may be achieved in a number of different ways including using a transaction centric methodology, an activity centric methodology, and/or a correction centric methodology.

With the transaction centric methodology, it is assumed that the simulation of the computer system using the model of the computer system is comprised of a plurality of components, connections between components, and transactions between components. A transaction is an interaction, such as a transfer of data, communication or the like, between components of a computer system in the model of the computer system. In the transaction centric methodology, transactions are assigned, by the sender component for the transaction, i.e. the initiator of the transaction, a required fidelity level of the receiver component that is to receive the transaction, i.e. the target of the transaction sent by the sender component. The particular required fidelity level that is assigned to the transaction may be specified according to a predetermined listing of transaction types and corresponding require fidelity levels. For example, one might want to have I/O transactions have a higher fidelity than heartbeat transactions, for example. The particular required fidelity levels that are to be assigned to different types of transactions may be user configurable so as to emphasize different types of transactions over others with regard to fidelity of the simulation.

When a sender component, during the simulation, attempts to send a transaction to a receiver component, the sender component associates a required fidelity level with the transaction based on the specified listing of transaction types and their associated required fidelity levels. If a specific required fidelity level is not assigned to this particular transaction type, then a default required fidelity level may be utilized, e.g., a lowest required fidelity level may be used as a default. Upon receiving a transaction during the simulation, the receiver component in the model of the computer system modifies its own fidelity value to match the required fidelity level if necessary. This may involve setting a value to cause the precision of the model of the receiver component to be changed, swapping in another model of the receiver component that is designed for the specified required fidelity level, or the like.

Such modification of the model of the receiver component may be performed, for example, in response to the required fidelity level being higher than a current fidelity value of the model of the receiver component, e.g., the model of the receiver component is designed or set for a "medium" fidelity value whereas the required fidelity level of the transaction is a "high" fidelity. In an alternative embodiment, such modification may be performed whenever the current fidelity value setting of the model of the receiver component does not exactly match the required fidelity level of the transaction such that the fidelity value of the model of the receiver component can be reduced when the transaction does not require a higher fidelity value setting. For purposes of the following description, it will be assumed that changes to the model of the receiver component are performed only in response to the required fidelity level of a transaction being higher than the current fidelity value of the model of the receiver component.

In order to specify the required fidelity level of the transaction, each transaction includes a marking indicator of the fidelity level of the transaction which may be set to a specific value by the sender component in the simulation. The setting of the value for this required fidelity level marking indicator may be determined based on one or more listings of transaction types and associated required fidelity levels. For example, in one illustrative embodiment, the sender component may have its own associated local required fidelity level listing that is used by the sender component for transactions sent by the sender component. Other sender components may have their own separate local required fidelity level listings that they may use when sending transactions. In addition, or alternatively, a global required fidelity level listing may be provided for use with transactions from all sender components. In one illustrative embodiment, this global required fidelity level listing may be used to set the required fidelity level marking indicator when not specifically overridden by a local required fidelity level listing for the same transaction type. Moreover, a default required fidelity level may be established such that any transaction types not having a specific entry in one of the local or global listings may have their required fidelity level marking indicator set to this default required fidelity level.

The listings of transaction types and corresponding required fidelity levels may take many different forms. In one illustrative embodiment, the transaction types may be associated with a type of action that is being requested as part of the transaction. For example, a transaction may have a type of "I/O transaction," "Memory transaction," "management transaction," or the like. Various required fidelity levels may be assigned based on the desired emphasis to be provided to transactions of particular types. These required fidelity levels may be specified by user input and/or may be automatically determined based on other settings of the simulation, e.g., a general setting of a desired emphasis for the simulation or the like. The required fidelity levels may be specified as fidelity values as described previously so that they can be compared to the fidelity values associated with models of components in the model of the computer system. For example, in one illustrative embodiment, required fidelity levels may have values of "high," "medium," or "low," similar to the fidelity values associated with the models of the components.

Figure 6:
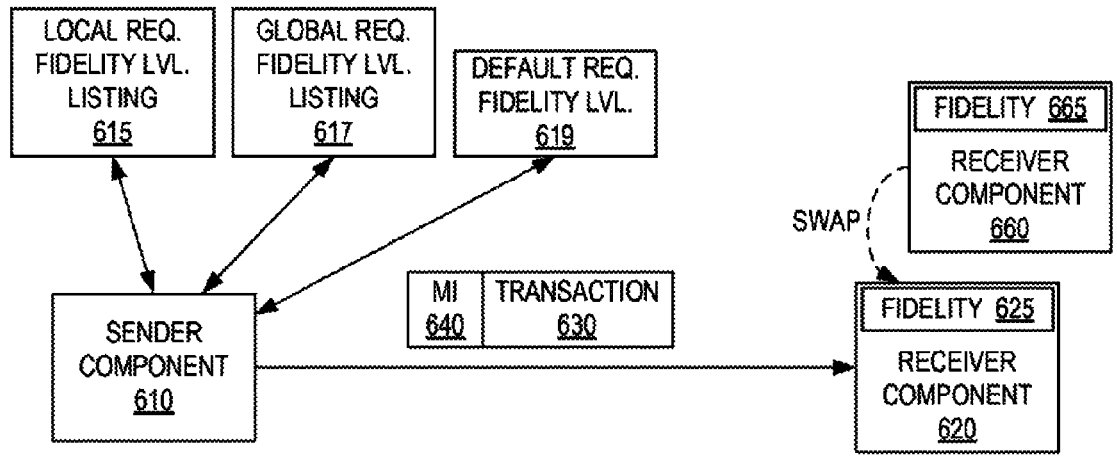
FIG. 6 is an example diagram to illustrate the transaction centric methodology for dynamically adjusting the fidelity value of a model of a component in accordance with one illustrative embodiment.

FIG. 6 is an example diagram to illustrate the transaction centric methodology for dynamically adjusting the fidelity value of a model of a component in accordance with one illustrative embodiment. The operations illustrated in FIG. 6 may be performed, for example, by the dynamic fidelity modification engine 470 in FIG. 4, by a combination of the dynamic fidelity modification engine 470 and the simulation logic 420, or the like.

As shown in FIG. 6, a sender component 610 may, during the simulation of the computer system using the model of the computer system, which includes models of the components 610 and 620, may attempt to send a transaction 630 to a receiver component 620. The transaction includes a marking indicator 640 that indicates a required fidelity level for the transaction 630. This marking indicator 640 is set by the sender component 610 based on one or more of the local required fidelity level listing data structure 615, the global required fidelity level listing data structure 617, and/or a default required fidelity level 619.

The receiver component 620 has an associated fidelity value 625 against which the required fidelity level specified in the marking indicator 640 of the transaction 630 is compared. If there is a match or the fidelity value 625 is higher than the required fidelity level specified in the marking indicator 640, then no modification to the receiver component 620 is needed. However, if there is not a match or the fidelity value 625 is lower than the required fidelity level specified in the marking indicator 650, then the fidelity value 625 of the receiver component 620 is modified to match the required fidelity level specified in the marking indicator 640 or another model 660 of the receiver component 620 that provides the required fidelity level is swapped in to replace the original receiver component 620. As mentioned above, in some illustrative embodiments, by changing a fidelity value associated with a component, the precision with which the model of the component is executed during the simulation may be modified. This swapping in or setting of the fidelity value of the receiver component may be repeated with each transaction from each possible sender component in the model of the computer system such that multiple swaps of values/models may be performed during the course of a simulation.

Figure 7:
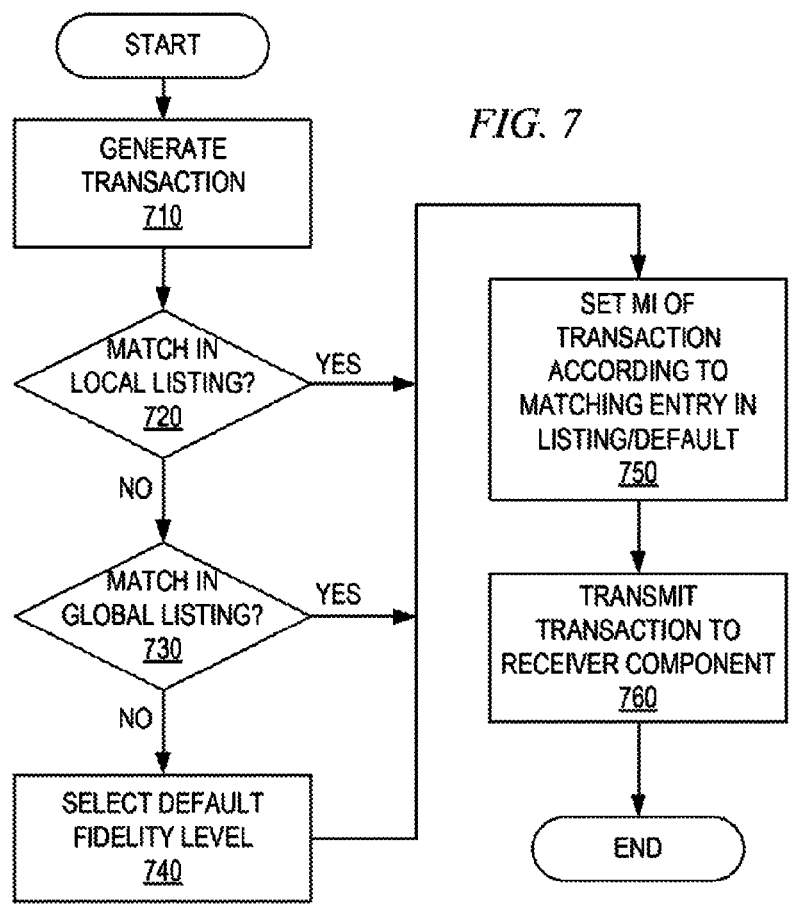
FIG. 7 is a flowchart outlining an example operation of a sender component when using the transaction centric methodology for dynamic adjustment of fidelity values in accordance with one illustrative embodiment.
Figure 8:
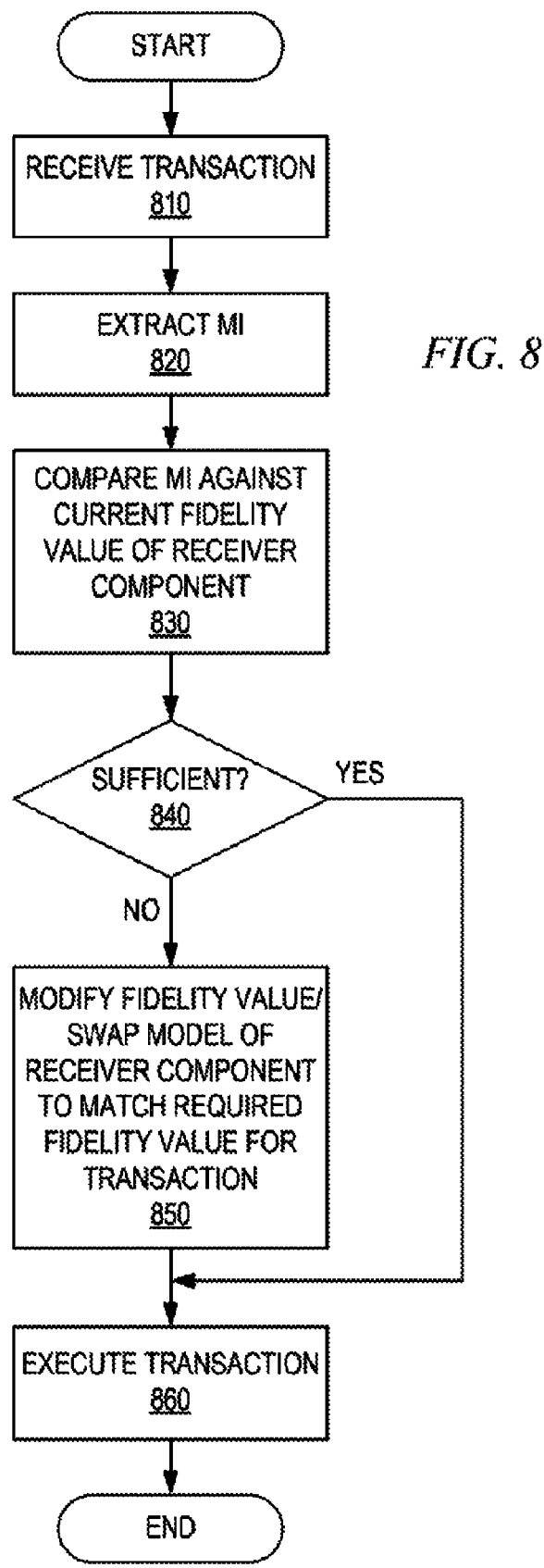
FIG. 8 is a flowchart outlining an example operation of a receiver component when using the transaction centric methodology for dynamic adjustment of fidelity values in accordance with one illustrative embodiment.

FIG. 7 is a flowchart outlining an example operation of a sender component when using the transaction centric methodology for dynamic adjustment of fidelity values in accordance with one illustrative embodiment. The operations described in FIGS. 7-8 are performed within a simulation of a computer system. Thus, where it is stated that a "transaction is generated," "a receiver component compares," and the like, this is intended to mean that within the simulation such operations are being virtually performed by the simulation logic using the models and other mechanisms of the simulation engine 400 in FIG. 4.

As shown in FIG. 7, the operation starts with the generation of a transaction by a sender component for transmission to a receiver component (step 710). A determination is made as to whether a local required fidelity level listing for the sender component has an entry corresponding to the transaction type of the generated transaction (step 720). If not, then a determination is made as to whether a global required fidelity level listing has an entry corresponding to the transaction type (step 730). If not, a default required fidelity level is selected (step 740). Thereafter, or if either of steps 720 or 730 result in an affirmative outcome, the marking indicator of the transaction is set to a value corresponding to a required fidelity level specified for the transaction type in the corresponding listing (step 750). The transaction is then transmitted to the receiver component (step 760) and the operation terminates.

FIG. 8 is a flowchart outlining an example operation of a receiver component when using the transaction centric methodology for dynamic adjustment of fidelity values in accordance with one illustrative embodiment. As shown in FIG. 8, the operation starts with receiving a transaction from a sender component (step 810). The marking indicator of the required fidelity level is extracted (step 820) and compared against the current fidelity value of the current model of the receiver component (step 830). A determination is made as to whether the current fidelity value of the current model of the receiver component is sufficient for the required fidelity level (step 840). If not, then the fidelity value for the receiver component is modified to match the required fidelity level or a model of the receiver component, associated with a fidelity value corresponding to the required fidelity level of the transaction, is swapped in to the simulation (step 850). Thereafter, or if the current fidelity value is sufficient for the required fidelity level, the transaction is executed (step 860) and the operation terminates.

In addition to, or alternative to, the transaction centric methodology for dynamically updating the fidelity values of models of components within a model of a computer system, the illustrative embodiments may further utilize an activity centric methodology for dynamically updating fidelity values based on the changes in activity level of the various components of the computer system throughout the simulation. That is, the activity centric methodology uses the component activity level to determine when it is appropriate to lower fidelity values of models of components. As activity drops down, the model of the component may have its fidelity value reduced or may be interchanged for a lower fidelity model of the component. This will cause an increase in performance of the simulation while having minimal impact on the fidelity of the overall simulation since the component is not being highly utilized in the simulation.

Activity is defined as the incoming and/or outgoing service requests or transactions by other components to the current component or from the current component to other components. For example, activity of a component may be measured as a total number of transactions sent and/or received during a predetermined period of time prior to the current time of the simulation. A lack of activity represents the idea that the particular component is in an idle loop and is not being utilized in the simulation. The mechanisms of the illustrative embodiments may detect when components go into an idle loop, or when components activity levels are reduced significantly enough to warrant reduction of their fidelity values.

This activity measure may be compared against one or more thresholds to determine if the activity level of the component is such that reduction in fidelity of the model of the component is warranted. For example, a comparison may be made against a first threshold to reduce a component from a "high" fidelity value to a "medium" fidelity value and a comparison may be made against a second threshold to reduce the component from a "medium" fidelity value to a "low" fidelity value. In one illustrative embodiment, the mechanisms of the illustrative embodiments simply detect when the activity level of a component is zero, i.e. no transactions are being processed by the component, such that the component is determined to be in an idle state.

The monitoring of component activity levels can be performed in a number of different ways. In one illustrative embodiment, a counter may be associated with each component that counts the number of transactions processed by the component within a predetermined period of time, the counter being reinitialized at the end of each predetermined period of time. If the number of transactions is less than one or more thresholds, then a reduction in fidelity value for the component is determined to be desirable.

In an alternative embodiment, a transaction flag value be associated with the component and may be set each time a transaction is processed by the component, if it is not already set. Periodically, such as when an associated timer expires, a check may be made of the transaction flag value to determine if the component processed a transaction within the periodic time. If the transaction flag value is not set, then a counter may be incremented and a comparison of the counter value to a threshold may be performed. If the counter value exceeds the threshold value, then it is determined that the component has become idle and the fidelity value of the component may be reduced. If the transaction flag is set, then the component is not idle and the fidelity value is not changed by the operation of the activity centric methodology. After this check, the timer is reset and the transaction flag for the component is reset. The counter value may be reinitialized in response to a determination that the component has entered an idle state and the fidelity value is reduced.

Figure 9:
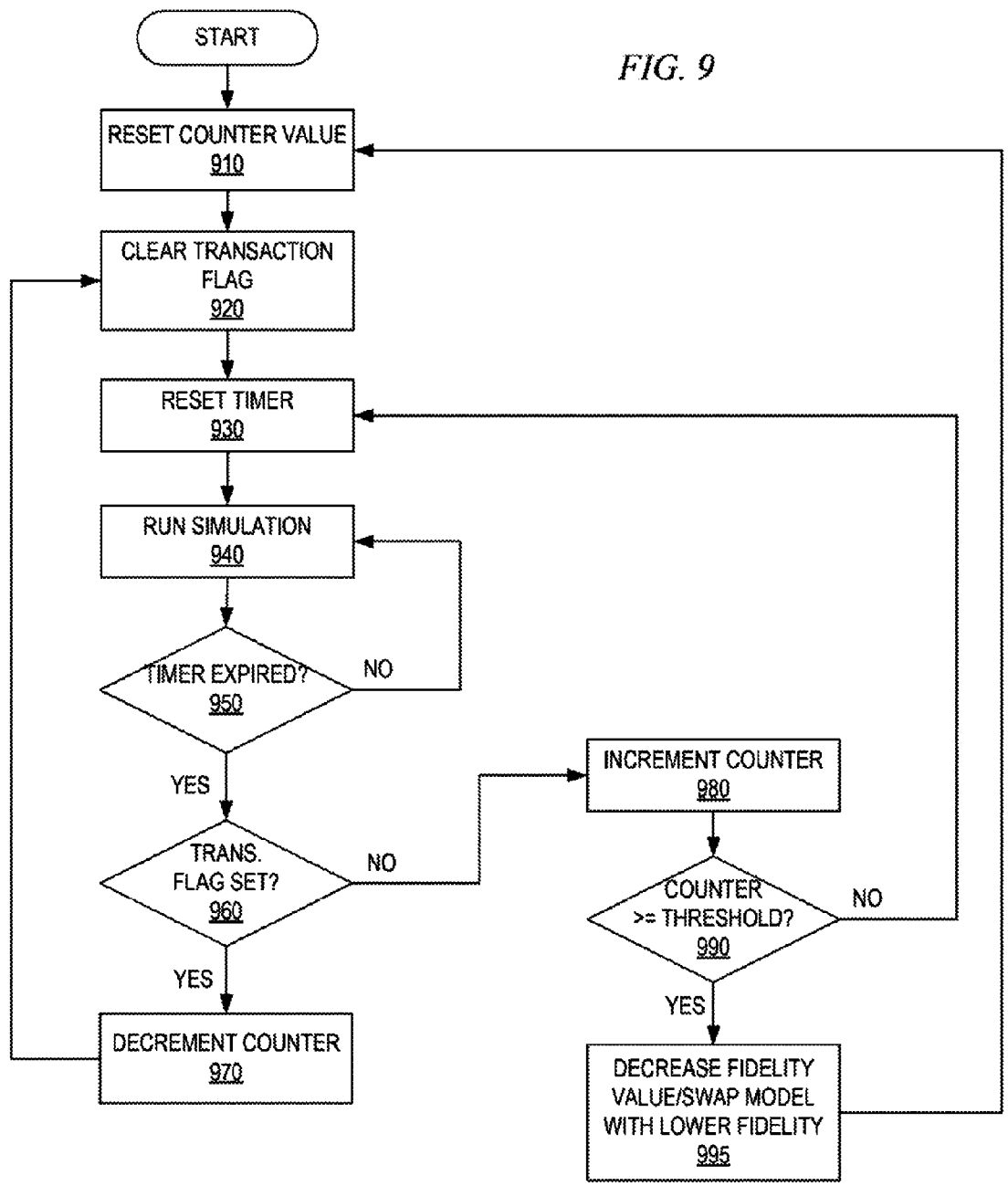
FIG. 9 is a flowchart of an operation of a activity centric methodology for dynamically updating fidelity settings of a model of a component in a simulation of a computer system in accordance with one illustrative embodiment.

FIG. 9 is a flowchart of an operation of a activity centric methodology for dynamically updating fidelity settings of a model of a component in a simulation of a computer system in accordance with one illustrative embodiment. The operation outlined in FIG. 9 may be implemented, for example, by the dynamic fidelity modification engine 470 in FIG. 4 in concert with the simulation logic 420, computer system model database 440, and/or other elements of the simulation system 400 in FIG. 4. In particular, the simulation logic 420 may maintain counters and timers for determining activity levels of components, the simulation logic 420 or the model database 440 may maintain transaction flag values for the components for determining if a transaction has been handled by the component within a predetermined period of time, and the like.

The operation outlined in FIG. 9 assumes that a mechanism is in place whereby a transaction flag is associated with components of a model of a computer system and the transaction flag is set in response to the component processing a transaction. As shown in FIG. 9, the operation starts with a resetting of the counter value for the component under consideration (step 910), clearing a transaction flag value associated with the component (step 920), and resetting the timer associated with the component (step 930). For purposes of this description, it will be assumed that the timer is associated with a single component, however the operation may be repeated for each component in an embodiment where the timer is associated with the simulation of the computer system as a whole.

The simulation is permitted to continue running (step 940) and a determination is made as to whether the timer associated with a particular component has expired during the simulation of the computer system (step 950). If the timer has not expired, the operation returns to step 940. If the timer has expired, a determination is made as to whether a transaction flag of the component is set indicating a transaction was processed by the component during the time interval measured by the timer (step 960). If the transaction flag has been set, then a counter value associated with the component is decremented (step 970), and the operation returns to step 920.

If the transaction flag was not set, then the counter associated with the component is incremented (step 980) and a determination is made as to whether the counter value is greater than or equal to a predetermined threshold (step 990). If not, then the operation returns to step 930. If the counter value is greater than or equal to the predetermined threshold (step 990), then the fidelity value of the model of the component is decreased or a model with a lower fidelity value is swapped in for the component (step 995). This operation may continue repeatedly during the course of the simulation and may be terminated upon termination of the simulation or upon the occurrence of another event, such as a user input specifying a command to discontinue the operation of the activity centric dynamic fidelity value modification methodology.

As yet another mechanism for dynamically changing the fidelity values of components during a simulation of a computer system, a corrective methodology for selecting fidelity values for components may be provided. With this corrective methodology, one or more of the components in a simulation of a computer system may be instrumented so that as the entire simulation proceeds in time, components within the computer system being simulated may speculatively increase or decrease the fidelity values of the components based on actions within the component. Based on specific behaviors of the components, the computer system simulation may create a checkpoint of its total state and then change the fidelity of one or more components. A checkpoint comprises the total state of all the models, their current fidelity levels, any internal data, and any transactions pending, in progress, or just received. The checkpoint is essentially a "snapshot" of the entire model of the computer system at a particular moment in time. Should an error occur, e.g., a missed prediction of fidelity requirements, the simulation may be restored to the checkpointed state and select a different fidelity value or value(s) for the one or more components and resume the simulation. Checkpoints may only be created when the model of the computer system enters a checkpointable state, as defined by the model's specific implementation, e.g., a state within a state machine that quiesces or is in an "idle" state, no pending transactions are being received or sent, no processing is occurring within the model, or during execution of an "idle" loop within a model.

A cost function may be used to calculate a cost associated with changing the fidelity of the one or more components during the simulation so as to prevent "thrashing" between two fidelity levels. For example, this cost function may look at how often the fidelity of the same component has changed within a predetermined time of the simulation, how often more than one component has changed within a predetermined time of the simulation, or the like, and associate costs to these situations to determine if a change in fidelity is desirable or not based on the cost.

Checkpoints may be generated at predetermined increments in simulation time. Each model of a component in the model of the computer system is responsible for implementing its own checkpoint methodology but all of the models share a common application program interface (API) that includes the ability to create a checkpoint, load/store internal state data for the model, change the fidelity value of the model of the component, determine if the mode is in a checkpointable state, determine that a fidelity mismatch has occurred, determine the current fidelity value of the model of the component, and determine a minimum fidelity value required to continue execution.

A model of a component may indicate to the simulation logic 420, at any point during the simulation of the computer system, that a mismatch in the fidelity of the model of the component has occurred. Such a mismatch in the fidelity of the model is indicative of a problem with the operation of the computer system being simulated. For example, a fidelity mismatch may occur when a transaction is sent to the component and the component is not able to handle the particular transaction. A "mismatch" may be any functional error within the simulation of the computer system using the model of the computer system. For purposes of this description, it will be assumed that this error is due to a mismatch between the necessary fidelity required to complete a transaction and the actual fidelity of the component processing the transaction.

Figure 10:
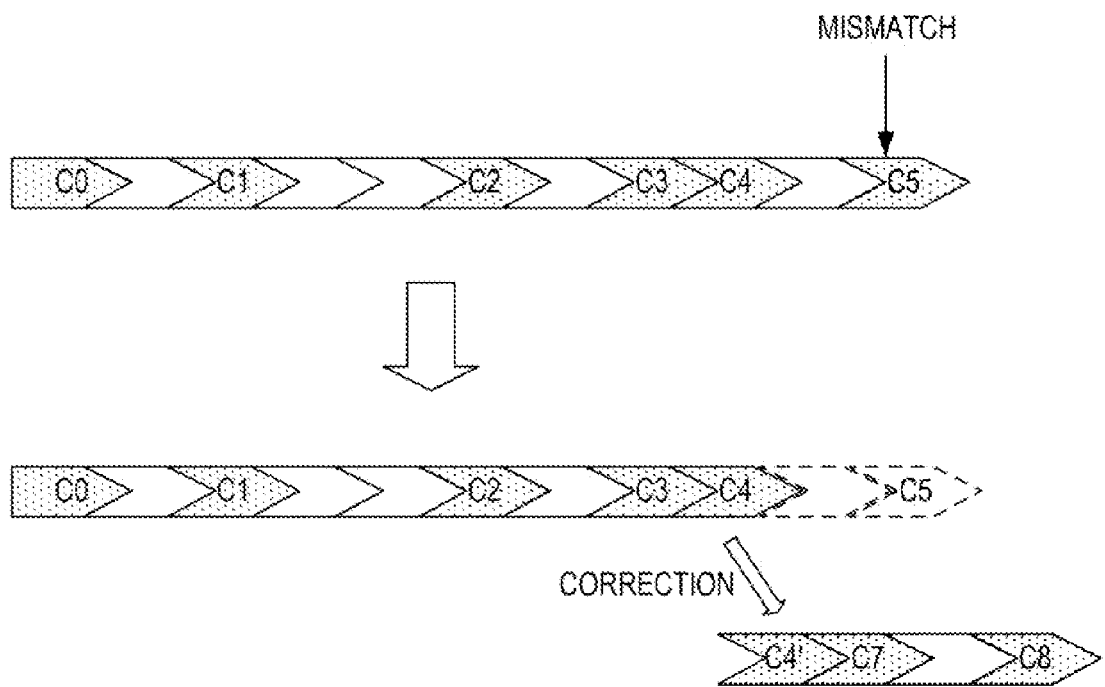
FIG. 10 is an example timeline view of checkpoints during an example simulation in accordance with one illustrative embodiment.

As shown in FIG. 10, which is a timeline view of checkpoints during an example simulation in accordance with one illustrative embodiment, the simulation proceeds with checkpoints being generated at regularly scheduled times until a mismatch is encountered by a component of the model of the computer system. In response to this mismatch, a checkpoint may be generated (shown in FIG. 10 as checkpoint C5) and a determination is made as to whether the simulation should be restored to a previously generated checkpoint based on the relative costs for restoring the simulation to a previous checkpoint. That is, for each checkpoint that is currently maintained in the simulation, a cost is calculated and a lowest-cost valid checkpoint is selected. In the depicted example, the checkpoint C4 is determined to be a lowest cost checkpoint to use for restoring the state of the simulation of model of the computer system. For example, the checkpoint C4 may be determined to be a lowest cost based on the number of models of components that would need to be modified to return to the state of the checkpoint C4. More complex cost determinations may be used as a basis for selecting a checkpoint without departing from the spirit and scope of the illustrative embodiments.

Having selected the checkpoint C4 as the checkpoint to which to restore the simulation of the computer system, the correction is performed to return the state of the various models of the components of the computer system to the previous checkpointed state, including fidelity value settings or swapping in models of components that utilize the fidelity values specified in the checkpoint. Thereafter, a new checkpoint (C4') is created based on this restored and more accurate model of the computer system and its state, and the simulation execution is continued (C7-C8 . . . ).

It should be noted that, depending upon the cost function used, the currently generated checkpoint C5 may be the lowest cost function but is invalid since it is associated with the simulation time point where a mismatch is detected. In such a case, the next lowest cost valid checkpoint may be selected. Checkpoints may include a valid bit that may be set or reset in response to the checkpoint being determined to be invalid. Alternatively, any maintained checkpoints that have a simulation timestamp prior to a simulation time at which the mismatch was detected may be considered to be valid. Thus, a check of timestamps may be used to determine validity of checkpoints.

As mentioned above, the selection of the checkpoint to which to restore the state of the simulation is based on a calculated cost. The cost of each checkpoint may be simple or complicated depending upon the particular implementation desired. The cost may simply refer to the relative age of a checkpoint or may be much more complicated, such as for example taking into account a combination of multiple factors. One example of a complex cost function that may be used may be as follows:

Cost=$T$*(current time−checkpoint time)+$N$*(Number of affected components)+$M$*(Number of mismatches in recent history)+$R$*(Restore Operation Time/Resources)+$E$*(Degree of Allowed Error)

where T, N, M, R, and E are weighting values.

This process of correction based modification of fidelity values for models of components based on checkpoints may be repeated many times within a simulation, resulting in multiple branches of simulation with older checkpoints being purged. For example, checkpoints older than a predetermined amount of time from a current simulation time may be automatically purged or rendered invalid. As another example, the simulation logic 420 or dynamic fidelity modification engine 470 may be configured to only maintain a predetermined number of prior checkpoints with all older checkpoints being automatically purged or rendered invalid.

Figure 11:
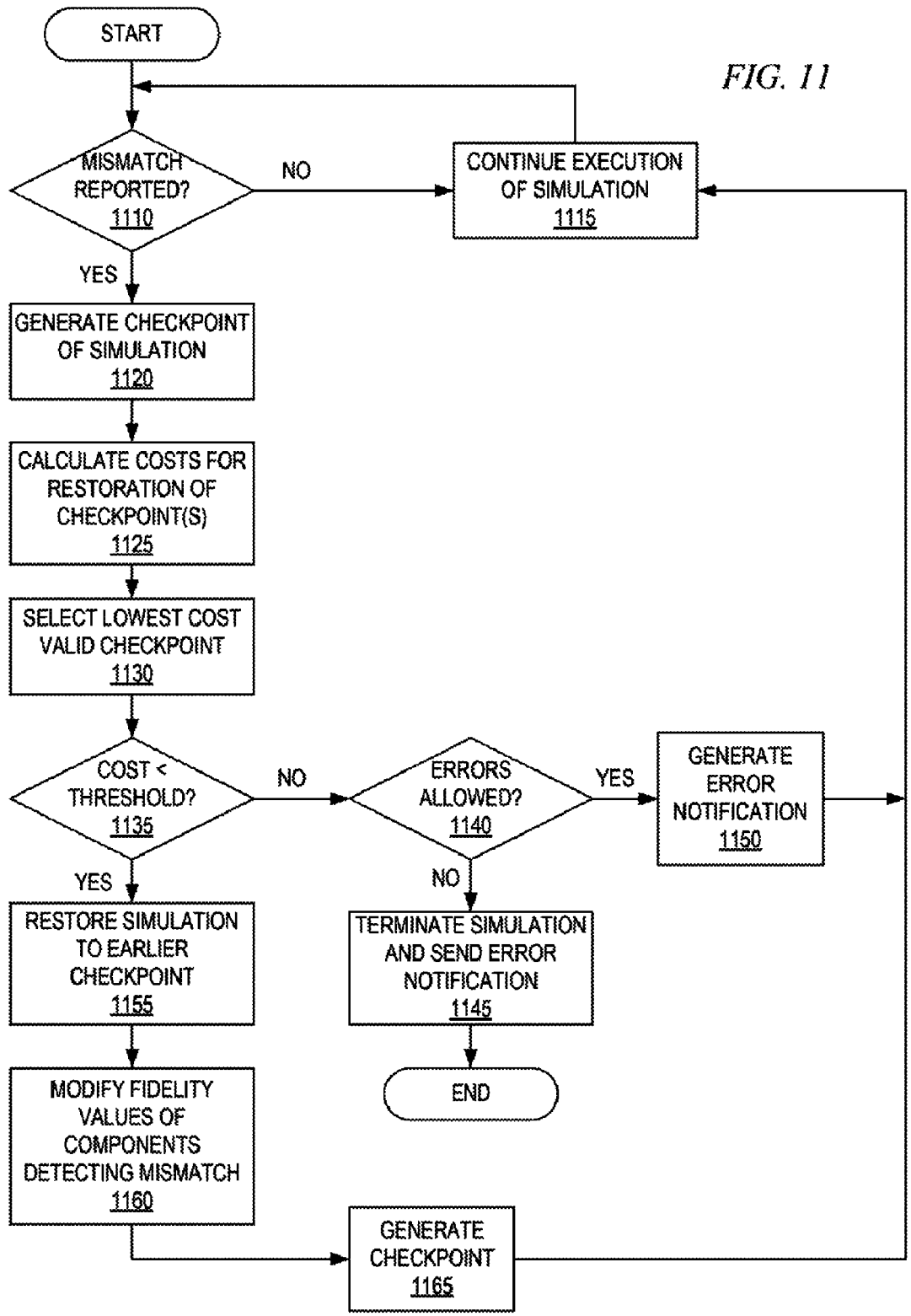
FIG. 11 is a flowchart outlining an operation for performing a corrective methodology for dynamically adjusting validity values of models of components in accordance with one illustrative embodiment.

FIG. 11 is a flowchart outlining an operation for performing a corrective methodology for dynamically adjusting validity values of models of components in accordance with one illustrative embodiment. The operation outlined in FIG. 11 may be performed, for example, by the dynamic fidelity modification engine 470 in FIG. 4 in concert with the simulation logic 420, computer system model database 440, and/or other elements of the simulation system 400 in FIG. 4.

As shown in FIG. 11, the operation starts during the simulation of a computer system, by checking to see if there is a mismatch reported by a component of the computer system model (step 1110). If not, the simulation execution is continued (step 1115). If a mismatch is detected, then a checkpoint of the simulation of the computer system is generated (step 1120). Costs for restoring prior checkpoints are generated for each of the previous checkpoints maintained by the simulation system (step 1125).

A lowest cost valid checkpoint is selected based on these costs (step 1130) and a determination is made as to whether the lowest cost is less than a predetermined threshold (step 1135). This threshold is used as a basis for determining if the least cost alternative is still too costly to warrant the restoration to the checkpoint or if an error or termination of the simulation should be performed instead.

If the lowest cost valid checkpoint's cost is greater than this threshold, then a determination is made as to whether the simulation allows errors (step 1140). For example, if no valid checkpoint is found (i.e. no checkpoint has a cost lower than the threshold) the simulation must either terminate or continue. If the simulation terminates, the execution of the simulation to that point may or may not be valid. If the simulation is allowed to continue, the execution of the simulation may still derive some value depending on the type of simulation (e.g., within the simulation, a given component may experience a fault, but other components may be unaffected and may possibly continue execution). Thus, one may determine whether to allow errors or not based on whether the error is likely to affect the simulation as a whole or is localized and useful information can be obtained from continuing the simulation even in the event of an error.

If errors are not allowed, then the simulation is terminated with an error state notification (step 1145) and the operation ends. If errors are allowed, then an error notification is generated (step 1150) and the operation continues to step 1120.

If the cost of the lowest cost valid checkpoint is lower than the threshold (step 1135), then the simulation is restored to the lowest costs valid checkpoint state (step 1155). The fidelity value of the models of components detecting a mismatch are then modified to a fidelity value that is valid for resolving the mismatch (step 1160). The system is then checkpointed (step 1165) and the operation returns to step 1120 where the simulation continues using the restored and modified state of the models of the components. This operation may be repeated with each detected mismatch during the simulation.

Thus, in addition to providing a mechanism for fidelity center based assignment of fidelity values that achieves a balance between fidelity and performance, the mechanisms of the illustrative embodiments provide dynamic means for adjusting the fidelity values of components of a model of a computer system based on the dynamic operation of the simulation. This allows the simulation to be adjusted to achieve the most optimum performance/fidelity tradeoff.

As a further improvement provided by the mechanisms of the illustrative embodiments, the simulation engine further includes a mechanism for predictively determining the fidelity value settings for components of a model of a computer system based on a history of fidelity mismatches. For example, the optimal simulation fidelity prediction engine 480 in FIG. 4 may comprise logic for working with the transaction centric dynamic mechanisms described above. In particular this logic may monitor the actual transaction runtime fidelity and the required fidelity and may track increases/decreases in fidelity values based on whether a receiver component provides the required fidelity for the transaction or not. Based on this information, a trend of fidelity values and changes in fidelity values for individual components of the model of the computer system may be generated. This trend information may be used to anticipate the fidelity value that should be provided by the receiver component in future transactions, thereby avoiding the performance impact of changing the fidelity value of the component during runtime of the simulation.

For example, during a simulation, transactions may be sent to a component requiring a high fidelity value but the component only provides a medium fidelity value. In accordance with the transaction centric methodology described above, the component's fidelity value may be dynamically adjusted to the required fidelity value and the fact that such a change had to be made may be logged in the simulation system 400 on a per-component basis. Such a log entry may include information regarding the component's fidelity value, the transaction's required fidelity value, the fact that the component's fidelity value needed to be modified to achieve the required fidelity value, and the amount (positive or negative) by which the fidelity value had to be adjusted to provide the required fidelity value. This information may be logged over a predetermined number of transactions and a trend may be generated for the particular component.

Once enough log information is generated for determining a trend, the trend may be used as a basis for setting a new fidelity value for the component prior to the performance of a next transaction targeting the component. The particular function used for determining the new fidelity value for the component may take many different forms and may be very simple or very complex. In one illustrative embodiment, if, for a current transaction, it is determined that the component's fidelity value was less than required for the transaction, a first trend calculation may be used that adds to the fidelity value of the model of the receiver component based on the trend. If it is determined that the current transaction's required fidelity value is less than the fidelity value provided by the receiver component, then a second trend calculation may be used to subtract from the fidelity value of the model of the receiver component based on the trend. In this way, if the component's fidelity value is too low, it may be increased to thereby increase fidelity but reduce performance. If the component's fidelity value is too high, it may be decreased to thereby increase performance and reduce fidelity.

In one example embodiment, the trend may be determined over a last N transactions handled by a receiver component, where N is some integer value set depending upon the desired implementation. The logged information for the last N transactions may be analyzed to determine that the component's fidelity value is "y" and it was "x" units less precise than the required fidelity value for the transactions. In such a case, a first trend calculation may be that the fidelity value for the model of the component may be set to a value equal to y+(2*x). Similarly, if the analysis of the logged information for the last N transactions results in a determination that the component's fidelity value is "y" and it was "x" units more precise than the required fidelity value for the transactions, then the component's fidelity value may be set to y-(2*x). It should be appreciated that the x value may be determined in many different ways including taking an average of the differences between actual and required fidelity values over the N previous transactions or taking any other statistical measure of differences between actual and required fidelity values.

Figure 12:
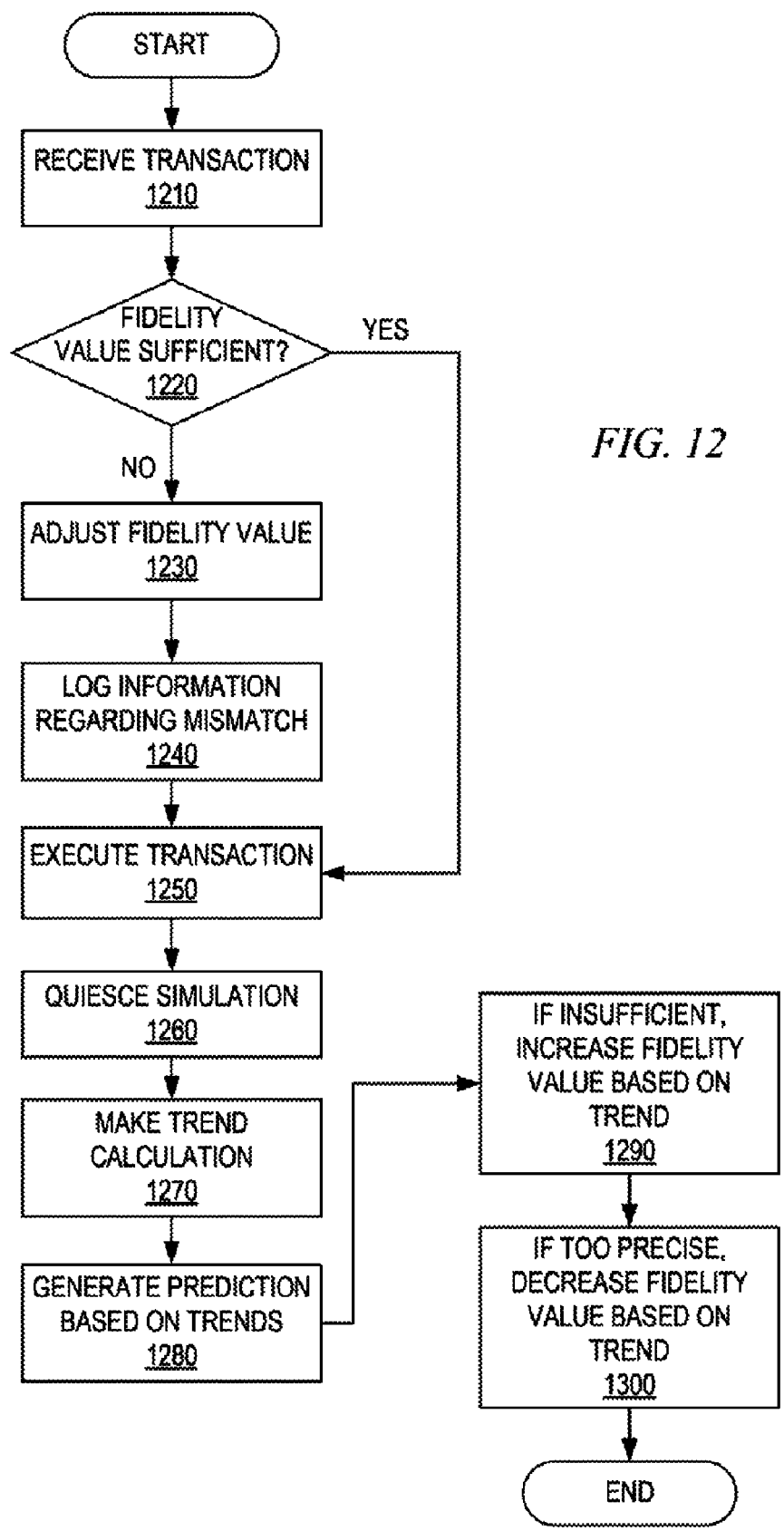
FIG. 12 is a flowchart outlining an example operation for using fidelity prediction to adjust the fidelity of a model of a component in accordance with one illustrative embodiment.

FIG. 12 is a flowchart outlining an example operation for using fidelity prediction to adjust the fidelity of a model of a component in accordance with one illustrative embodiment. Such an operation may be performed, for example, by the logic of the optimal simulation fidelity prediction engine 480 in FIG. 4 in conjunction with one or more of the other elements shown in FIG. 4.

The operation in FIG. 12 assumes that a number of transactions 1 to N targeting a particular receiver component have been executed during the simulation of the computer system with logs of the actual and required fidelity values being generated. The operation then begins with the receipt of a transaction targeting the same receiver component (step 1210). A determination is made as to whether the fidelity value of the component is sufficient for the required fidelity value of the transaction (step 1220). If not, the component fidelity value is adjusted, using one or more of the methodologies previously described above (step 1230) and information regarding the fidelity value mismatch is logged (step 1240). Thereafter, or if the component's fidelity value is sufficient, the transaction is executed (step 1250) and the state of the simulation is quiesced so that a predictive evaluation may be performed (step 1260).

A trend calculation for the component is made (step 1270) and a prediction is made as to whether the trend indicates the fidelity value of the component to be insufficient for processing a next transaction (1280). If the fidelity value of the component will be insufficient for processing the next transaction, then the fidelity value of the component is set according to a trend calculation function to increase the fidelity value based on the trend (step 1290). If the fidelity value of the component is too precise for processing, i.e. is too high, then a fidelity value of the component is set according to a trend calculation function to reduce the fidelity value based on the trend (step 1300). The operation then terminates.

Thus, in addition to the mechanisms for setting fidelity values based on a fidelity center methodology and the dynamic adjustment mechanisms for dynamically adjusting the fidelity values of components of a model of a computer system, the illustrative embodiments further provide mechanisms for predictively determining fidelity values based on historical trends of mismatches in fidelity values provided and required fidelity values of transactions. This again helps to improve performance of the simulation while providing a highest possible fidelity of the simulation.

It should be appreciated that the various methodologies for dynamic modification of fidelity values associated with models of components in a model of a computer system, as well as the methodology for fidelity prediction, may be used together in any combination. That is, two or more of the dynamic modification methodologies may be used together to dynamically update the fidelity values of models of the components in the model of the computer system. These two or more dynamic modification methodologies may be used on conjunction with the fidelity center methodologies for initially/periodically assigning fidelity values previously described above. Moreover, these two or more dynamic modification methodologies may be used in conjunction with the fidelity prediction mechanisms described above during simulation of the computer system using the model of the computer system.

It should further be appreciated that while the illustrative embodiments are described in terms of simulations of computer systems using models of computer systems and their components, the illustrative embodiments are not limited to such. Rather, the mechanisms of the illustrative embodiments may be utilized with simulations of any systems of components in which fidelities of components may be set and/or dynamically updated so as to achieve a balance between fidelity of the simulation and performance of the simulation. Thus, rather than simulating a computer system, the simulation may be of human resources between departments of an organization, simulations of organic systems, simulations of ecosystems, finite element or finite volume analysis, atmospheric modeling, structural analysis, or the like.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for controlling a fidelity of a simulation of a system, comprising:
   receiving a model of the system, wherein the model of the system comprises a plurality of individual components of the system;
   assigning fidelity values to models of the individual components of the system;
   assigning a required fidelity value to transactions between components in the plurality of individual components of the system;
   executing a simulation of the system using the model of the system and the models of the individual components of the system; and
   dynamically adjusting fidelity values of one or more of the models of the individual components of the system during the execution of the simulation based on the required fidelity values assigned to the transactions, wherein a first transaction sent from a sender component to a receiver component comprises a first required fidelity value, and wherein dynamically adjusting fidelity values of one or more of the models of the individual components of the system based on the required fidelity values assigned to the transactions comprises adjusting a fidelity value associated with a model of the receiver component based on the first required fidelity value of the first transaction.

2. The method of claim 1, wherein the first required fidelity value is assigned to the first transaction by the sender component when generating the transaction during the simulation.

3. The method of claim 1, wherein adjusting a fidelity value associated with the model of the receiver component further comprises one of setting a parameter value associated with the model of the receiver component to change a precision used by the model of the receiver component or swapping in a different model of the receiver component, the different model using a precision corresponding to the adjusted fidelity value.

4. The method of claim 1, wherein adjusting the fidelity value associated with the model of the receiver component is performed in response to a determination that the required fidelity value of the transaction does not match a current fidelity value of the model of the receiver component.

5. The method of claim 1, wherein adjusting the fidelity value associated with the model of the receiver component is performed in response to a determination that the required fidelity value of the transaction is higher than a current fidelity value of the model of the receiver component.

6. The method of claim 2, wherein the first required fidelity value is assigned to the transaction by the sender component based on one of a local required fidelity level listing data structure associated with the sender component or a global required fidelity level listing data structure used by the plurality of components to assign required fidelity values with transactions.

7. The method of claim 6, wherein the local required fidelity level listing data structure and the global required fidelity level listing data structure associates required fidelity levels with corresponding transaction types.

8. The method of claim 7, wherein entries in the local required fidelity level listing data structure for a transaction type override entries in the global required fidelity level listing data structure for the transaction type.

9. A computer program product comprising a computer readable storage device having a computer readable program stored therein, wherein the computer readable program, when executed on a computing device, causes the computing device to:
receive a model of a system to be simulated, wherein the model of the system comprises a plurality of individual components of the system;
assign fidelity values to models of the individual components of the system;
assign a required fidelity value to transactions between components in the plurality of individual components of the system;
execute a simulation of the system using the model of the system and the models of the individual components of the system; and
dynamically adjust fidelity values of one or more of the models of the individual components of the system during the execution of the simulation based on the required fidelity values assigned to the transactions, wherein a first transaction sent from a sender component to a receiver component comprises a first required fidelity value, and wherein the computer readable program causes the computing device to dynamically adjust fidelity values of one or more of the models of the individual components of the system based on the required fidelity values assigned to the transactions by adjusting a fidelity value associated with a model of the receiver component based on the first required fidelity value of the first transaction.

10. The computer program product of claim 9, wherein the first required fidelity value is assigned to the first transaction by the sender component when generating the transaction during the simulation.

11. The computer program product of claim 9, wherein the computer readable program causes the computing device to adjust a fidelity value associated with the model of the receiver component by one of setting a parameter value associated with the model of the receiver component to change a precision used by the model of the receiver component or swapping in a different model of the receiver component, the different model using a precision corresponding to the adjusted fidelity value.

12. The computer program product of claim 9, wherein adjusting the fidelity value associated with the model of the receiver component is performed in response to a determination that the required fidelity value of the transaction does not match a current fidelity value of the model of the receiver component.

13. The computer program product of claim 9, wherein adjusting the fidelity value associated with the model of the receiver component is performed in response to a determination that the required fidelity value of the transaction is higher than a current fidelity value of the model of the receiver component.

14. The computer program product of claim 10, wherein the first required fidelity value is assigned to the transaction by the sender component based on one of a local required fidelity level listing data structure associated with the sender component or a global required fidelity level listing data structure used by the plurality of components to assign required fidelity values with transactions.

15. The computer program product of claim 14, wherein the local required fidelity level listing data structure and the global required fidelity level listing data structure associates required fidelity levels with corresponding transaction types.

16. The computer program product of claim 15, wherein entries in the local required fidelity level listing data structure for a transaction type override entries in the global required fidelity level listing data structure for the transaction type.

17. An apparatus, comprising:
a processor; and
a memory coupled to the processor, wherein the memory comprises instructions which, when executed by the processor, cause the processor to:
receive a model of a system to be simulated, wherein the model of the system comprises a plurality of individual components of the system;
assign fidelity values to models of the individual components of the system;
assign a required fidelity value to transactions between components in the plurality of individual components of the system;
execute a simulation of the system using the model of the system and the models of the individual components of the system; and
dynamically adjust fidelity values of one or more of the models of the individual components of the system during the execution of the simulation based on the required fidelity values assigned to the transactions, wherein a first transaction sent from a sender component to a receiver component comprises a first required fidelity value, and wherein the instructions cause the processor to dynamically adjust fidelity values of one or more of the models of the individual components of the system based on the required fidelity values assigned to the transactions by adjusting a fidelity value associated with a model of the receiver component based on the first required fidelity value of the first transaction.

18. The apparatus of claim 17, wherein the first required fidelity value is assigned to the first transaction by the sender component when generating the transaction during the simulation.

19. The apparatus of claim 17, wherein the instructions cause the processor to adjust a fidelity value associated with the model of the receiver component by one of setting a parameter value associated with the model of the receiver component to change a precision used by the model of the receiver component or swapping in a different model of the receiver component, the different model using a precision corresponding to the adjusted fidelity value.

20. The apparatus of claim 17, wherein adjusting the fidelity value associated with the model of the receiver component is performed in response to a determination that the required fidelity value of the transaction does not match a current fidelity value of the model of the receiver component.

21. The apparatus of claim 17, wherein adjusting the fidelity value associated with the model of the receiver component is performed in response to a determination that the required fidelity value of the transaction is higher than a current fidelity value of the model of the receiver component.

22. The apparatus of claim 17, wherein the first required fidelity value is assigned to the transaction by the sender component based on one of a local required fidelity level listing data structure associated with the sender component or a global required fidelity level listing data structure used by the plurality of components to assign required fidelity values with transactions.

23. The apparatus of claim 21, wherein the local required fidelity level listing data structure and the global required fidelity level listing data structure associates required fidelity levels with corresponding transaction types.

24. The apparatus of claim 22, wherein entries in the local required fidelity level listing data structure for a transaction type override entries in the global required fidelity level listing data structure for the transaction type.

\* \* \* \* \*